US012805008B2

(12) United States Patent
Xie et al.

(10) Patent No.: US 12,805,008 B2
(45) Date of Patent: Nov. 17, 2026

(54) GATE REDUCTION OR REMOVAL BETWEEN DUAL MIDDLE DIELECTRIC ISOLATION

(71) Applicant: INTERNATIONAL BUSINESS MACHINES CORPORATION, Armonk, NY (US)

(72) Inventors: Ruilong Xie, Niskayuna, NY (US); Jingyun Zhang, Albany, NY (US); Julien Frougier, Albany, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 657 days.

(21) Appl. No.: 18/351,727

(22) Filed: Jul. 13, 2023

(65) Prior Publication Data

US 2025/0022880 A1 Jan. 16, 2025

(51) Int. Cl.
*H10D 84/85* (2025.01)
*H10D 30/01* (2025.01)
(Continued)

(52) U.S. Cl.
CPC ......... *H10D 84/856* (2025.01); *H10D 30/014* (2025.01); *H10D 30/43* (2025.01);
(Continued)

(58) Field of Classification Search
CPC .... H10D 84/856; H10D 30/014; H10D 30/43; H10D 30/6735; H10D 62/121;
(Continued)

(56) References Cited

U.S. PATENT DOCUMENTS 9,431,539 B2 8/2016 Qi
10,192,819 B1 1/2019 Chanemougame
(Continued)

FOREIGN PATENT DOCUMENTS

CN 114639720 A 6/2022

OTHER PUBLICATIONS

Mertens, et al. "Forksheet FETs for Advanced CMOS Scaling: Forksheet-Nanosheet Co-Integration and Dual Work Function Metal Gates at 17nm N-P Space." Published Dec. 2021. 4 pages. 2021 Symposium on VLSI Technology (2021): 1-2.
(Continued)

*Primary Examiner* — William B Partridge
*Assistant Examiner* — John Patrick Cornely
(74) *Attorney, Agent, or Firm* — Seed Intellectual Property Law Group LLP

(57) ABSTRACT

A transistor includes a gate structure with reduced gate region or eliminated gate region located between a top MDI region and a bottom MDI region. The reduced gate region has a reduction of conductive material therewithin and may be formed due to the presence of prefabricated wide inner spacers between the top MDI region and the bottom MDI region. The no gate region has an absence of conductive material therewithin and may be formed due to the presence of a prefabricated inner spacer that is between, and has a coplanar perimeter with, the top MDI region and the bottom MDI region. By reducing or eliminating the conductive material of the gate structure between the dual MDI structure, parasitic capacitance otherwise associated therewith is reduced.

9 Claims, 18 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2025.01) |
| ***H10D 84/03*** | (2025.01) |
| ***H10D 88/00*** | (2025.01) |

(52) U.S. Cl.

CPC ....... *H10D 30/6735* (2025.01); *H10D 62/121* (2025.01); *H10D 64/017* (2025.01); *H10D 64/018* (2025.01); *H10D 84/0167* (2025.01); *H10D 84/0184* (2025.01); *H10D 84/038* (2025.01); *H10D 88/01* (2025.01)

(58) Field of Classification Search

CPC ............... H10D 64/017; H10D 64/018; H10D 84/0167; H10D 84/0184; H10D 84/038; H10D 88/01; H10D 30/0198; H10D 30/501; H10D 30/6757; H10D 84/0188; H10D 84/851; H10D 88/00; B82Y 10/00

See application file for complete search history.

(56) References Cited

U.S. PATENT DOCUMENTS

| | | | |
|---|---|---|---|
| 10,192,867 | B1 | 1/2019 | Frougier |
| 10,256,158 | B1 | 4/2019 | Frougier |
| 11,502,079 | B2 | 11/2022 | Song |
| 11,616,062 | B2 | 3/2023 | Ju |
| 2012/0061637 | A1 | 3/2012 | Cai |
| 2022/0044973 | A1 | 2/2022 | Cheng |
| 2022/0157936 | A1 | 5/2022 | Khaderbad |
| 2023/0090092 | A1 | 3/2023 | Lilak |
| 2023/0095447 | A1 | 3/2023 | Xie |

OTHER PUBLICATIONS

Shen, et al., “A new technique for evaluating stacked nanosheet inner spacer TDDB reliability,” 2020 IEEE International Reliability Physics Symposium (IRPS), Dallas, TX, USA, 2020, pp. 1-5, doi: 10.1109/IRPS45951.2020.9129258.

GATE REDUCTION OR REMOVAL BETWEEN DUAL MIDDLE DIELECTRIC ISOLATION

BACKGROUND

The present disclosure relates to fabrication methods and resulting structures for semiconductor devices. More specifically, the present disclosure relates to fabrication methods and resulting semiconductor integrated circuit (IC) devices that include a gate that has a reduced or removed portion between dual middle dielectric isolation (MDI) regions.

Conventional transistors, such as semiconductor IC devices, or the like, incorporate planar field effect transistors (FETs) in which current flows through a semiconducting channel between a source and a drain in response to a voltage applied to a control gate. The semiconductor industry strives to obey Moore's law, which holds that each successive generation of integrated circuit devices shrinks to half its size and operates twice as fast. As device dimensions have shrunk, however, conventional silicon device geometries and materials have had trouble maintaining switching speeds without incurring failures such as, for example, leaking current from the device into the semiconductor substrate. Several new technologies emerged that allowed chip designers to continue shrinking transistor sizes. A FET, generally, is a transistor in which output current, i.e., source-drain current, is controlled by a voltage applied to an associated gate. A FET typically has three terminals, i.e., a gate structure, a source region, and a drain region. A gate structure is a structure used to control output current (i.e., flow of carriers in the channel) of a semiconducting device through electrical or magnetic fields. A channel is the region of the FET underlying the gate structure and between the source and drain of the semiconductor IC device that becomes conductive when the semiconductor device is turned on. The source is a doped region in the semiconductor IC device, in which a majority carriers are flowing into the channel. A drain is a doped region in the semiconductor IC device located at the end of the channel, in which carriers are flowing out of the transistor through the drain.

One technology change modified the structure of the FET from a planar device to a three-dimensional device in which the semiconducting channel was replaced by a fin that extends out from the plane of the substrate. In such a device, commonly referred to as a FinFET, the control gate wraps around three sides of the fin to influence current flow from three surfaces instead of one. The improved control achieved with a 3D design results in faster switching performance and reduced current leakage. Building taller devices has also permitted increasing the device density within the same footprint that had previously been occupied by a planar FET.

The FinFET concept was further extended by developing a gate all-around FET, or GAA FET, in which the gate fully wraps around one or more channels for maximum control of the current flow therein. In the GAA FET, the channels can take the form of nanolayers, nanosheets, or the like, that are isolated from the substrate. In the GAA FET, channel surfaces are in respective contact with the source and drain and other respective channel surfaces are in contact with and surrounded by the gate.

SUMMARY

In an embodiment of the present disclosure, a vertically stacked transistor is presented. The vertically stacked transistor includes a bottom transistor that has a plurality of vertically arranged bottom channels and a top transistor that has a plurality of vertically arranged top channels. The vertically stacked transistor includes a dual middle dielectric isolation (MDI) structure that has a bottom MDI region and a top MDI region. The vertically stacked transistor includes a gate structure shared by the bottom transistor and the top transistor. The gate structure includes a reduced gate region between the bottom MDI region and the top MDI region where conductive material is reduced (e.g., a smaller gate length relative to a remainder of the gate structure). By reducing the conductive material of the gate structure between the bottom MDI region and the top MDI region, parasitic capacitance otherwise associated therewith is reduced.

In an example, the vertically stacked transistor also includes a first inner spacer between the bottom MDI region and the top MDI region and a second inner spacer between the bottom MDI region and the top MDI region. The first inner spacer and second inner spacer may be pre-formed relative to the gate structure and may therefore cause the gate structure to be fabricated therearound, thereby reducing the conductive material of the gate structure between the bottom MDI region and the top MDI region.

In an example, the reduced gate region is between the first inner spacer and the second inner spacer. Like above, the first inner spacer and second inner spacer may be pre-formed relative to the gate structure and may therefore cause the gate structure to be fabricated therearound, thereby reducing the conductive material of the gate structure between the bottom MDI region and the top MDI region.

In an example, the dual MDI structure is vertically in line with the bottom channels and the top channels. The dual MDI structure, the bottom channels, and the top channels may be vertically in line and have substantially vertical and coplanar sidewalls which may result in increased density of vertically stacked transistors which may increase device performance.

In an example, the vertically stacked transistor further includes a plurality of third inner spacers upon respective top surfaces or bottom surfaces of the bottom channels and the top channels, wherein the first inner spacer and the second inner spacer are wider than the plurality of third inner spacers. The relatively narrower inner spacers allow for relative more conductive material of the remaining gate structure (e.g., an increased gate length) relative to the reduced gate region.

In an example, the vertically stacked transistor further includes a source/drain (S/D) isolation region comprising a top surface above a top surface of the top MDI region and a bottom surface below a bottom surface of the bottom MDI region. The dual MDI structure therefore affects or influences the thickness of the S/D isolation region and provides for relatively increased separation between the top transistor and the bottom transistor.

In an example, the bottom transistor further includes a bottom S/D region connected to respective end surfaces of the bottom channels and connected to and below the S/D isolation region. By arranging the vertically stacked channels with respect to the S/D region, the footprint area of the transistor may be relatively reduced and may allow for further device scaling.

In an example, the top transistor further includes a top S/D region connected to respective end surfaces of the top channels and connected to and above the S/D isolation region. Like above, by arranging the vertically stacked channels with respect to the S/D region, the footprint area of the transistor may be relatively reduced and may allow for further device scaling.

In an example, the S/D isolation region is connected to the top MDI region, the first inner spacer, and the bottom MDI region. The dual MDI structure is related to the S/D isolation region and provides for relatively increased separation between the top transistor and the bottom transistor.

In an embodiment of the disclosure another vertically stacked transistor is presented. The vertically stacked transistor includes a bottom transistor that has a plurality of vertically arranged bottom channels and a top transistor that has a plurality of vertically arranged top channels. The vertically stacked transistor further includes a dual middle dielectric isolation (MDI) structure that has a bottom MDI region and a top MDI region. The vertically stacked transistor includes a first inner spacer between the bottom MDI region and the top MDI region. The first inner spacer includes perimeter sidewalls that are substantially coplanar with associated sidewalls of the bottom MDI region and the top MDI region. The first inner spacer effectively fills space between the bottom MDI region and the top MDI region and may result in the formation of a removed gate region where there is an absence of conductive gate material therebetween which may reduce parasitic capacitance otherwise associated therewith.

In an example, the vertically stacked transistor further includes a gate structure shared by the bottom transistor and the top transistor. The first inner spacer results in the gate structure having a no gate region where there is no gate between the bottom MDI region and the top MDI region. By removing the conductive material of the gate structure between the bottom MDI region and the top MDI region, parasitic capacitance otherwise associated therewith is reduced.

In an example, the dual MDI structure is vertically in line with the bottom channels and the top channels. The dual MDI structure, the bottom channels, and the top channels may be vertically in line and have substantially vertical and coplanar sidewalls which may result in increased density of vertically stacked transistors which may increase device performance.

In an example, the vertically stacked transistor further includes a plurality of second inner spacers upon respective top surfaces or bottom surfaces of the bottom channels and the top channels, wherein the first inner spacer and the plurality of second inner spacers are composed of the same material. The first inner spacer and the plurality of second inner spacers may be simultaneously formed in the same formation or deposition process and may therefore be composed of the same material.

In an example, the vertically stacked transistor further includes a source/drain (S/D) isolation region comprising a top surface above a top surface of the top MDI region and a bottom surface below a bottom surface of the bottom MDI region. The dual MDI structure therefore affects or influences the thickness of the S/D isolation region and provides for relatively increased separation between the top transistor and the bottom transistor.

In an example, the bottom transistor further includes a bottom S/D region connected to respective end surfaces of the bottom channels and connected to and below the S/D isolation region. By arranging the vertically stacked channels with respect to the S/D region, the footprint area of the transistor may be relatively reduced and may allow for further device scaling.

In an example, the top transistor further includes a top S/D region connected to respective end surfaces of the top channels and connected to and above the S/D isolation region. Like above, by arranging the vertically stacked channels with respect to the S/D region, the footprint area of the transistor may be relatively reduced and may allow for further device scaling.

In an example, the S/D isolation region is connected to the top MDI region, the first inner spacer, and the bottom MDI region. The dual MDI structure is related to the S/D isolation region and provides for relatively increased separation between the top transistor and the bottom transistor.

In another embodiment of the disclosure, a method of forming a semiconductor integrated circuit (IC) device is presented. The method includes simultaneously etching a first sacrificial nanolayer and a second sacrificial nanolayer that is located between a top middle dielectric isolation (MDI) region and a bottom MDI region. The etch forms a relatively wider indent of the second sacrificial nanolayer relative to a narrower indent of the first sacrificial nanolayer. The method further includes forming a wide inner spacer by depositing a dielectric material within the wider indent and forming a narrow inner spacer by depositing a dielectric material within the narrower indent. The wide inner spacer between the top MDI region and the bottom MDI region may be pre-formed relative to a gate structure which may result in the gate structure to have a reduced gate region between the bottom MDI region and the top MDI region where conductive material is reduced (e.g., a smaller gate length relative to a remainder of the gate structure). By reducing the conductive material of the gate structure between the bottom MDI region and the top MDI region, parasitic capacitance otherwise associated therewith is reduced.

In examples, the narrow inner spacer is located above the top MDI region or below the bottom MDI region. The relatively narrower inner spacers allow for relative more conductive material of the remaining gate structure (e.g., an increased gate length) relative to the reduced gate region.

The above summary is not intended to describe each illustrated embodiment or every implementation or example of the present disclosure.

BRIEF DESCRIPTION OF THE DRAWINGS

The drawings included in the disclosure are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1:
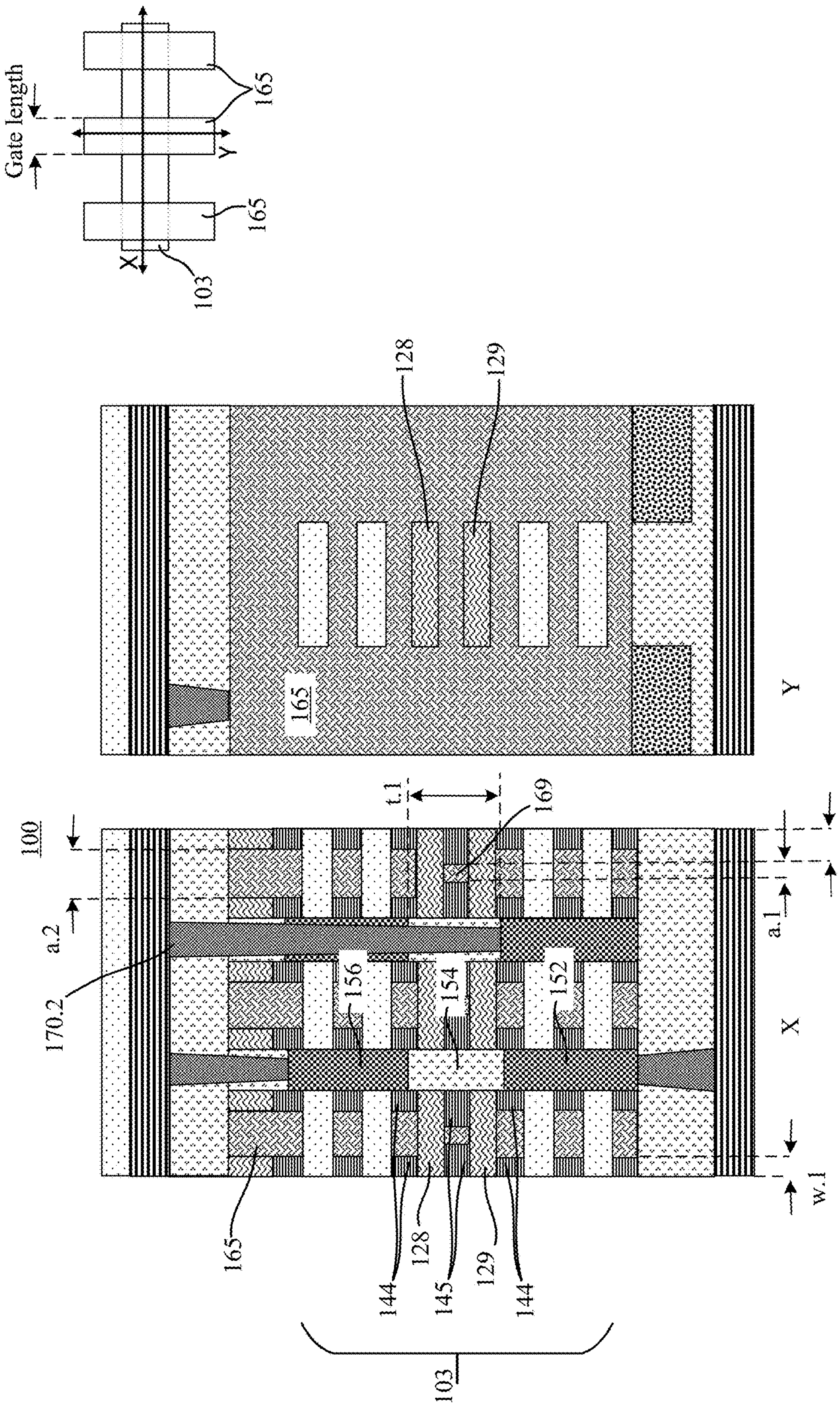
FIG. 1 depicts a semiconductor IC device that includes a gate with a reduced gate region between dual MDI regions, according to one or more embodiments of the disclosure.

The present disclosure describes an illustrative semiconductor IC device that includes at least one transistor, such as a GAA transistor, with a gate having a reduced gate region or eliminated gate region between dual MDI regions. There are many different types of transistors, such as but not limited to FinFETs, GAA FETs, fork sheet FETs, and the like. Though illustrative GAA FETs are depicted in the drawings, embodiments of the present disclosure should not be limited thereto and may be applied to other transistors that include a gate having a reduced gate region or eliminated gate region between dual MDI regions.

The flowcharts and cross-sectional diagrams in the drawings illustrate a method of fabricating semiconductor IC device, such as a processor, FPGA, memory module, or the like. In some alternative implementations, the fabrication steps may occur in a different order than that which is noted in the drawings, and certain additional fabrication steps may be implemented between the steps noted in the drawings. Moreover, any of the layered structures depicted in the drawings may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the depicted structure(s) as oriented. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, ±2%, or the like, difference between the coplanar materials.

As used herein, the term "coplanar" refers to two surfaces that lie in a common plane. In other words, two surfaces are coplanar if there exists a geometric plane that contains all of the points of both of the surfaces. Accordingly, two surfaces may be referred to as substantially coplanar despite deviations from coplanarity on an atomic scale, so long as those deviations do not impact the desired result of the coplanarity.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, e.g., 5:1, 10:1 or 20:1.

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. Various steps in the manufacture of semiconductor devices are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, a metal-oxide-semiconductor field-effect transistor (MOSFET) may be used for amplifying or switching electronic signals. The MOSFET has a source electrode, a drain electrode, and a metal oxide gate electrode. The metal gate portion of the metal oxide gate electrode is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (nFET) and p-type field effect transistors (pFET) are two types of complementary MOSFETs. The nFET includes n-doped source and drain junctions and uses electrons as the current carriers. The pFET includes p-doped source and drain junctions and uses holes as the current carriers. Complementary metal oxide semiconductor (CMOS) is a technology that uses complementary and symmetrical pairs of p-type and n-type MOSFETs to implement logic functions. As mentioned above, hole mobility on the pFET may have an impact on overall device performance.

The wafer footprint of an FET is related to the electrical conductivity of the channel material. If the channel material has a relatively high conductivity, the FET can be made with a correspondingly smaller wafer footprint. A method of increasing channel conductivity and decreasing FET size is to form the channel as a nanostructure, such as a nano wire, nano ribbon, nanolayer, nanosheet, or the like, hereinafter referred to as a nanolayer. For example, a GAA FET provides a relatively small FET footprint by forming the channel region as a series of vertically stacked nanolayers. In a GAA configuration, a GAA FET includes a source region, a drain region and vertically stacked nanolayer channels between the source and drain regions. These devices typically include one or more suspended nanolayers that serve as the channel. A gate surrounds the stacked nanolayers and regulates electron flow through the nanolayers between the source and drain regions.

GAA FETs may be fabricated by forming alternating layers of active nanolayers and sacrificial nanolayers. The sacrificial nanolayers are released from the active nanolayers before the FET device is finalized. For n-type FETs, the active nanolayers are typically silicon (Si) and the sacrificial nanolayers are typically silicon germanium (SiGe). For p-type FETs, the active nanolayers can be SiGe and the sacrificial nanolayers can be Si. In some implementations, the active nanolayers of a p-type FET can be SiGe or Si, and the sacrificial nanolayers can be Si or SiGe. Forming the nanolayers from alternating layers of active nanolayers formed from a first type of semiconductor material (e.g., Si for n-type FETs, and SiGe for p-type FETs) and sacrificial nanolayers formed from a second type of semiconductor material (e.g., SiGe for n-type FETs, and Si for p-type FETs) may provide for superior channel electrostatics control, which is necessary for continuously scaling or reducing gate lengths.

To further increase the transistor density at given footprint, one can stack one GAA FET over another GAA FET to accommodate high density of transistor at given area. One method to isolate top and bottom transistors is to form a bi-layer MDI structure. However, gate metal between the dual MDI layers increases circuit parasitic capacitance.

Therefore, the embodiments of the present disclosure provide a semiconductor IC device that includes a gate with a removed or reduced gate region between a top and bottom MDI region that form the dual MDI structure. The dual MDI structure provides for relatively increased separation between the top FET and bottom FET of the vertically stacked FET. The removed or reduced gate region between the top and bottom MDI region relatively reduces the parasitic capacitance, and thereby increases performance of the semiconductor IC device.

Referring now to FIG. 1, a cross-sectional view of a semiconductor IC device 100 is depicted that includes a replacement gate structure 165 with a reduced gate region 169 between a top MDI region 128 and a bottom MDI region 129 that together comprise the dual MDI structure. The reduced gate region 169 has a reduction of conductive gate material between the top MDI region 128 and the bottom MDI region 129. For example, the replacement gate structure 165 has a relatively smaller gate length between top MDI region 128 and the bottom MDI region 129. In other words, within the reduced gate region 169, the replacement gate structure 165 may have a gate length a.1 which is less than a gate length a.2 of a remainder of the replacement gate structure 165. By reducing the conductive material of the replacement gate structure 165 within the reduced gate region 169, parasitic capacitance otherwise associated therewith is reduced. For example, the reduced gate region 169 reduces the capacitance between the replacement gate structure 165 and frontside contact 170.2 relative to a replacement gate structure with a single or constant gate length (e.g., a replacement gate structure with a single or constant gate length a.2). The reduced gate region 169 may be formed due to the presence of prefabricated wide inner spacers 145 between the top MDI region 128 and the bottom MDI region 129. The wide inner spacers 145 have a width w.2 that is greater than a width w.1 of inner spacers 144 that are associated with the same replacement gate structure 165.

Also depicted on the right side of FIG. 1 is a top-down view of semiconductor IC device 100 that includes a footprint of one or more nanolayer stacks 103 and/or active areas associated therewith in relation to multiple replacement gate structures 165. The top-down view includes an X plane which is a vertical plane along the footprint of one or more nanolayer stacks 103 and/or active areas associated therewith and across the multiple replacement gate structures 165. The top-down view includes a Y plane which is a vertical plane across the footprint of one or more nanolayer stacks 103 and/or active areas associated therewith and along one replacement gate structure 165.

Figure 18:
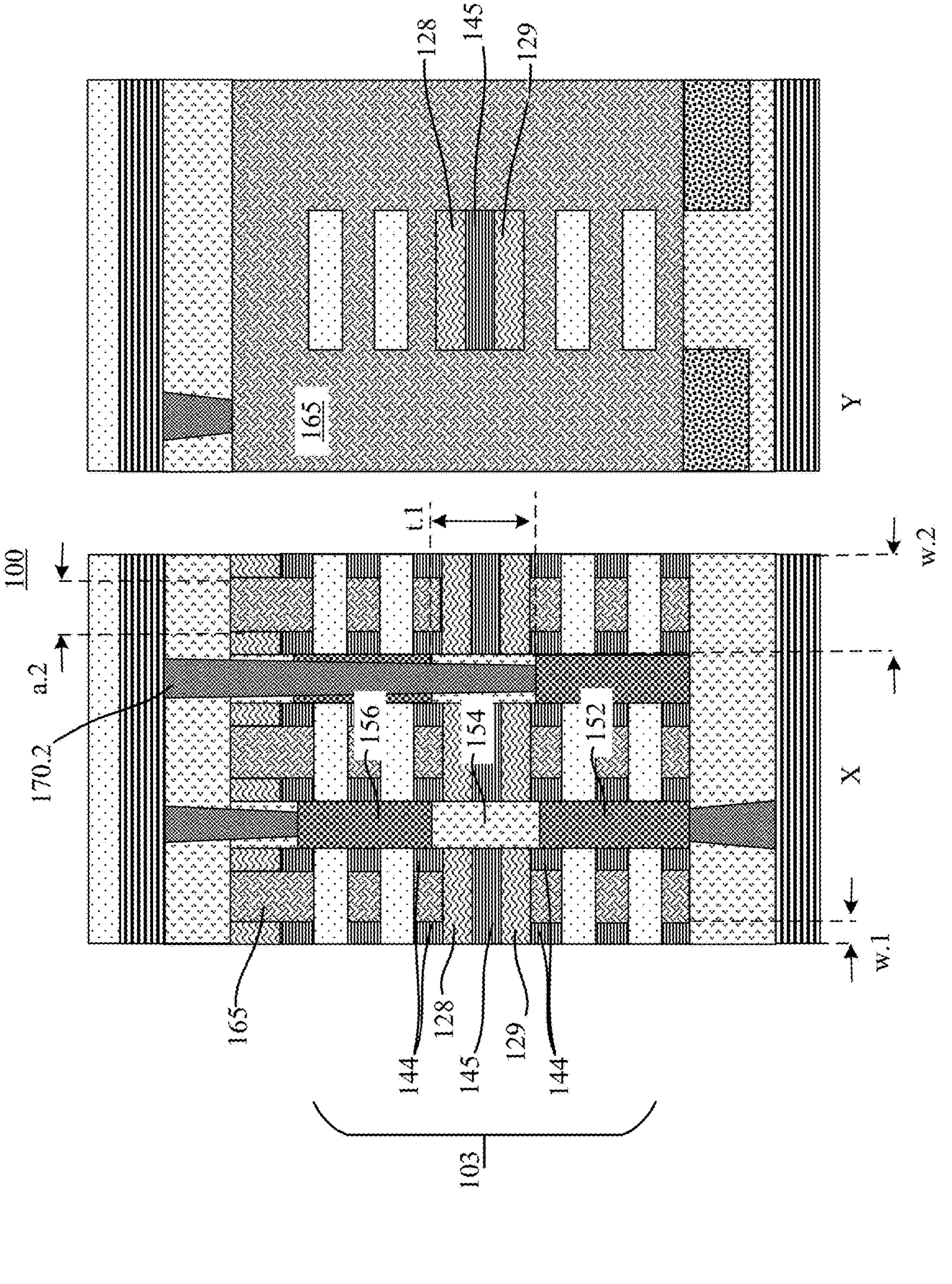
FIG. 18 depicts a semiconductor IC device that includes a gate with a removed or reduced gate region between dual MDI regions, according to one or more embodiments of the disclosure.

Referring now to FIG. 18, a cross-sectional view of a semiconductor IC device 100 is depicted that includes a replacement gate structure 165 that has a no gate region where conductive material is absent between the top MDI region 128 and the bottom MDI region 129 (e.g., there is no gate length between the top MDI region 128 and the bottom MDI region 129). The absence of conductive material of the replacement gate structure 165 between the top MDI region 128 and the bottom MDI region 129 results from the presence of inner spacer 145 therebetween. By eliminating the conductive material of the replacement gate structure 165 between the top MDI region 128 and the bottom MDI region 129, parasitic capacitance otherwise associated therewith is reduced. For example, the inner spacer 145 between the top MDI region 128 and the bottom MDI region 129 reduces the capacitance between the replacement gate structure 165 and frontside contact 170.2 relative to a replacement gate structure with conductive material between a top MDI region and bottom MDI region.

With reference to both FIG. 1 and to FIG. 18, the dual MDI structure may separate or influence an isolation region that separates a top FET and a bottom FET. For example, a source/drain (S/D) isolation region 154 is formed to separate a bottom S/D region 152 from a top S/D region 156. For example, the S/D isolation region 154 has a top surface that may be coplanar with or above a top surface of the top MDI region 128. Similarly, the S/D isolation region 154 has a bottom surface that may be coplanar with or below a bottom surface of the bottom MDI region 129. Therefore, the vertical dimension between the top surface of the top MDI region 128 and the bottom surface of the bottom MDI region 129 influences a thickness t.1 of the S/D isolation region 154 which may be greater relative to a thickness of an S/D isolation region that is associated with a single MDI region. In this manner, the dual MDI structure provides for relatively increased separation between the top FET (e.g., top S/D region 156, or the like) and the bottom FET (e.g., bottom S/D region 152, or the like).

Figure 2:
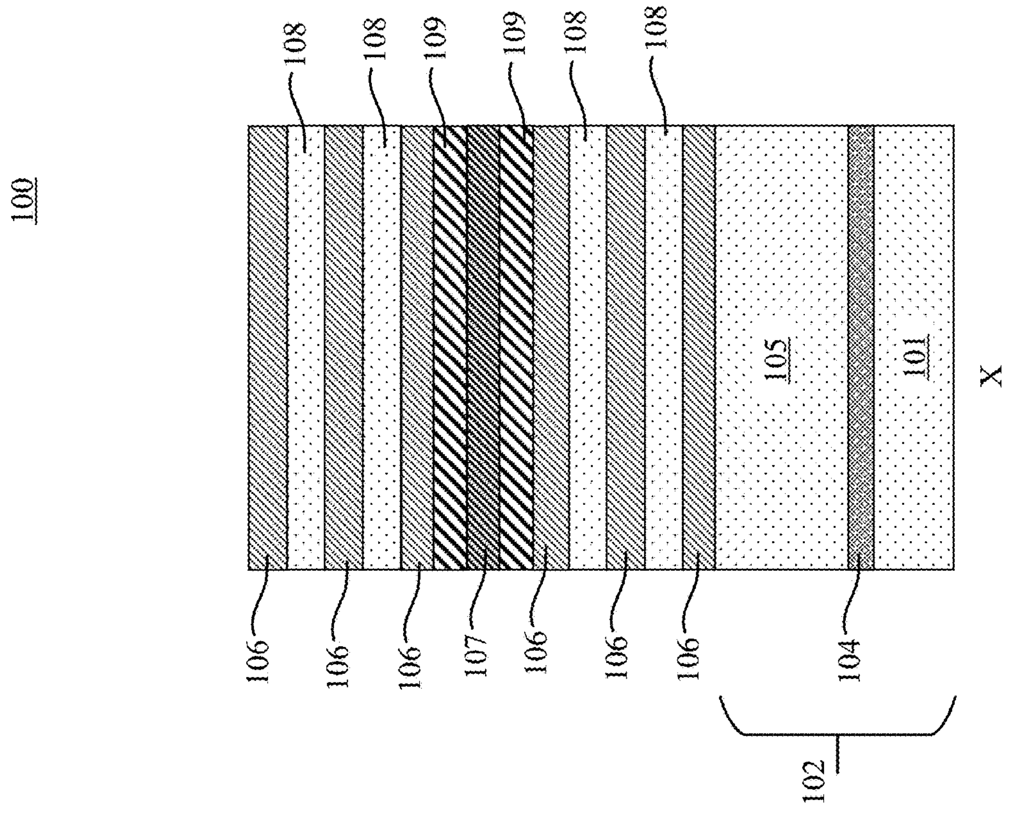
FIG. 2 through FIG. 16 depict various fabrication structure views of an exemplary semiconductor IC device that includes a gate with a reduced or removed gate region between dual MDI regions, according to one or more embodiments of the disclosure.

FIG. 2 depicts a cross-sectional view of the semiconductor IC device 100 after initial fabrication operations, in accordance with embodiments of the present disclosure. In these initial fabrication stages, nanolayers are formed upon a substrate structure 102.

The substrate structure 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon (Si) is the predominantly used semiconductor material in wafer fabrication, alternative semiconductor materials can be employed, such as, but not limited to, gallium arsenide, gallium nitride, cadmium telluride, zinc selenide, and III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

In the depicted implementation, the substrate structure 102 includes an upper substrate 105, a lower substrate 101, and an etch stop layer 104 between the upper substrate 105 and the lower substrate 101. The upper substrate 105 and the lower substrate 101 may be comprised of any other suitable material(s) that those listed above and the etch stop layer 104 may be a dielectric material with etch selectivity to one or both of the upper substrate 105 and/or the lower substrate 101. In one example, the etch stop layer 104 may be an oxide and the substrate structure 102 may be referred to as a buried oxide (BOX) substrate. The etch stop layer 104 can also be an epitaxial SiGe layer grown from substrate 101 and the upper substrate 105 can also be an epitaxial Si layer grown from etch stop layer 104.

The nanolayers may be formed over the substrate structure 102 by forming a first series of alternating blanket layers of sacrificial nanolayers 106 and active nanolayers 108. In certain examples, the first sacrificial nanolayer 106 material is initially formed directly on an upper surface of the substrate structure 102. In other examples, certain layer(s) may be formed between the upper surface of the substrate structure 102 and the first one of the sacrificial nanolayers 106. In an example, each sacrificial nanolayer 106 is composed of silicon-germanium (e.g., SiGe, where the Ge ranges from about 20-30%).

Next, a blanket layer of active nanolayer 108 material is formed on an upper surface of the first one of the sacrificial nanolayers 106. In an example, the active nanolayer 108 is composed of silicon. One or more additional blanket layers of the sacrificial nanolayers 106 and active nanolayers 108 may be alternately formed in the first series of alternating nanolayers. In the illustrated semiconductor IC device 100, there are a total of three sacrificial nanolayers 106 and two active nanolayers 108 in the first series of alternating nanolayers. However, it should be appreciated that any suitable number of alternating nanolayers may be formed.

The nanolayers may be further formed over the first series of nanolayers by forming an intermediary series of alternating blanket layers of sacrificial nanolayers 109 and sacrificial nanolayers 107. In certain examples, a first sacrificial nanolayer 109 is initially formed directly on an upper surface of the first series of nanolayers. In an example, each sacrificial nanolayer 109 is composed of silicon-germanium (e.g., SiGe, where the Ge ranges from about 55-65%).

Next, a blanket layer of sacrificial nanolayer 107 material is formed on an upper surface of the first sacrificial nanolayer 109. In an example, the sacrificial nanolayer 107 is composed of silicon-germanium (e.g., SiGe, where the Ge ranges from about 35-45%). An additional blanket sacrificial nanolayer 109 may be formed in the intermediary series of alternating blanket layers. In the illustrated semiconductor IC device 100, there are a total of two sacrificial nanolayers 109 and one sacrificial nanolayer 107 in the intermediary series of alternating blanket nanolayers. However, it should be appreciated that any suitable number of alternating nanolayers may be formed.

The nanolayers may be further formed by forming a second series of alternating blanket layers of sacrificial nanolayers 106 and active nanolayers 108. In certain examples, the first sacrificial nanolayer 106 of the second series of alternating nanolayers is initially formed directly on an upper surface of the intermediary series of alternating blanket nanolayers.

Next, a blanket layer of active nanolayer 108 material is formed on an upper surface of the first one of the sacrificial nanolayers 106 of the second series of alternating nanolayers. One or more additional blanket layers of the sacrificial nanolayers 106 and active nanolayers 108 may be alternately formed in the second series of alternating nanolayers. In the illustrated semiconductor IC device 100, there are a total of three sacrificial nanolayers 106 and two active nanolayers 108 in the second series of alternating nanolayers. However, it should be appreciated that any suitable number of alternating nanolayers may be formed.

Although it is specifically contemplated that the sacrificial nanolayers 106, the sacrificial nanolayers 107, and the sacrificial nanolayer 109 can be formed from SiGe and that the blanket active nanolayers 108 can be formed from Si, it should be understood that any appropriate materials can be used instead, as long as the semiconductor materials have etch selectivity with respect to one or more of the others, as is consistent with the description of the fabrication stages herein.

The alternating blanket nanolayers can be deposited by any appropriate mechanism. The alternating blanket nanolayers can be epitaxially grown from one another, but alternate deposition processes, such as chemical vapor deposition (CVD), physical vapor deposition (PVD), atomic layer deposition (ALD), or gas cluster ion beam (GCIB) deposition, are also contemplated.

In certain embodiments, each of the one or more of the blanket nanolayers has a vertical thickness ranging, for example, from approximately 3 nm to approximately 20 nm. In certain embodiments, the blanket nanolayers have a vertical thickness ranging, for example, from approximately 3 nm to approximately 10 nm. Although thirteen total blanket nanolayers are depicted in semiconductor IC device 100, it should be appreciated that the any suitable number of nanolayers may be utilized. Although the range of 3-20 nm is cited as an example range of thickness of the sacrificial blanket nanolayers, other thickness of these nanolayers may be used. In certain examples, certain of the sacrificial nanolayers 106, 107, and 109 and active nanolayers 108 may have different thicknesses relative to one another.

In certain embodiments, it may be desirable to have a small vertical spacing (VSP) between adjacent active nanolayers 108 in a stack of nanolayers to reduce the parasitic capacitance and to improve circuit speed. For example, the VSP (the distance between the bottom surface of a first active nanolayer 108 and the top surface of an adjacent active nanolayer 108) may range from 5 nm to 15 nm. However, the VSP must be of a sufficient value to accommodate the gate that will be formed in the spaces created by later removal of respective portions of the sacrificial nanolayers 106.

Figure 3:
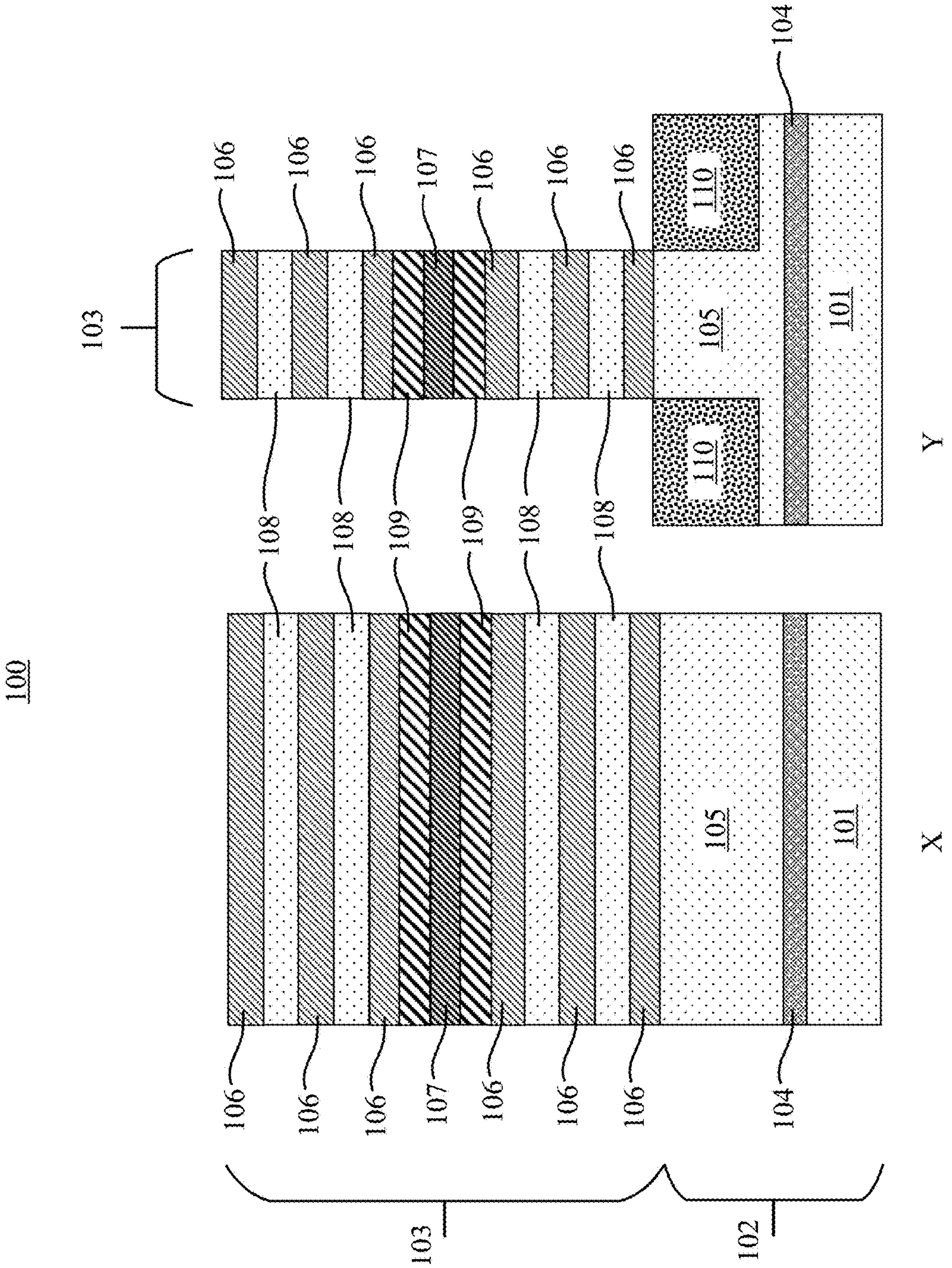

FIG. 3 depicts cross-sectional views of the semiconductor IC device 100 after fabrication operations, in accordance with embodiments of the present disclosure. In the depicted fabrication stages, the nanolayers are patterned into nanolayer stacks 103 and shallow trench isolation (STI) regions 110 are formed.

To form one or more nanolayer stacks 103, a mask layer (not shown) is formed on the uppermost nanolayer. The mask layer may be comprised of any suitable mask material(s). The mask layer may be patterned and used to perform the nanolayer stack 103 patterning process. In the nanolayer stack 103 patterning process, any suitable material removal process (e.g., reactive ion etching or RIE) may be used to remove portions of the alternating nanolayers down to the level of the substrate structure 102, or the like. Following the nanolayer stack 103 patterning process, one or more nanolayer stacks 103 are formed. Subsequently, the mask layer may be removed.

The removal of undesired portion(s) of the alternating nanolayers may further remove undesired portions of substrate structure 102 that are adjacent to respective footprints of nanolayer stacks 103 to form STI region openings. The etch may be timed or otherwise controlled to stop the removal of the substrate structure 102 such that the depth or bottom of the one or more STI region openings has a predetermined or desired dimension. For example, the depth or bottom of the one or more STI region openings may be above the etch stop layer 104, as depicted. In some examples, the etch to form the nanolayer stacks 103 may utilize the etch stop layer 104 to stop the etch and form the bottom of the one or more STI region openings.

A STI region 110 may be formed upon the substrate structure 102 below and adjacent to the nanolayer stacks 103 within the STI region openings. For example, one or more STI regions 110 may be formed by depositing electrical dielectric material(s) within the STI region openings adjacent to the one or more nanolayer stacks 103. A top surface of the one or more STI regions 110 may be coplanar with a top surface of substrate structure 102. The one or more STI regions 110 may have a volume that sufficiently electrically isolates components or features of neighboring transistors, or the like, and/or may sufficiently electrically isolate neighboring nanolayer stacks 103.

In an example, the STI region(s) 110 may be formed by depositing a STI liner within the STI region openings adjacent to the footprint of nanolayer stacks 103. Subsequently, STI region(s) 110 may be further formed by depositing STI dielectric material upon the STI liner. An etch back, recess, or the like, may be performed to remove undesired or over formed STI liner and/or STI dielectric material such that the top surface of the STI region(s) 110 is coplanar with a bottom surface of the bottom most sacrificial nanolayer 106. Exemplary materials for the STI liner may be SiN, or the like. Exemplary materials for the STI dielectric may be $SiO_2$, low-k oxide, or the like.

Figure 4:
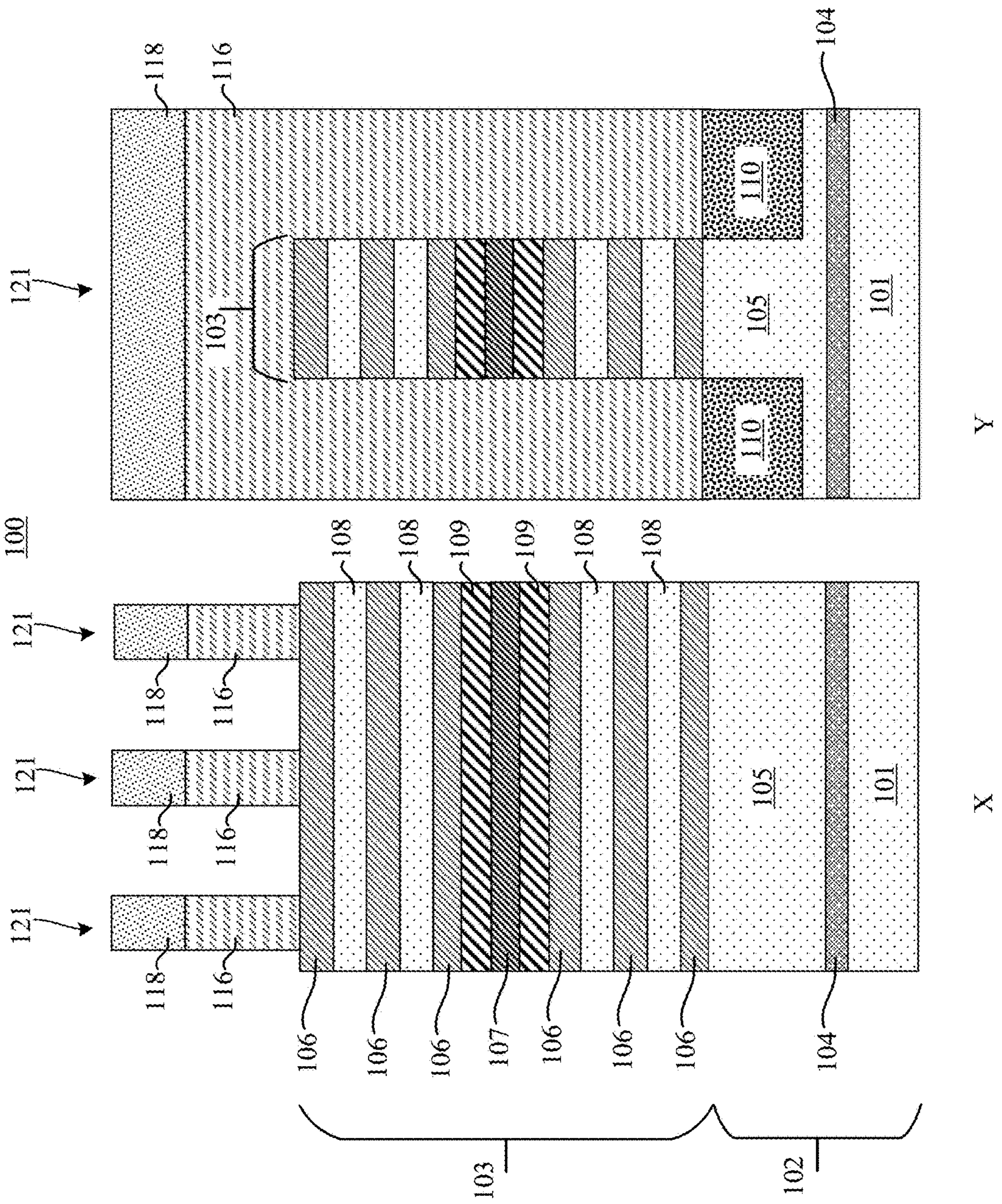

FIG. 4 depicts cross-sectional views of the semiconductor IC device 100 after fabrication operations, in accordance with embodiments of the present disclosure. In the depicted fabrication stages, one or more sacrificial gate structures 121 are formed upon STI regions 110 and upon and around the one or more nanolayer stacks 103. The one or more sacrificial gate structures 121 may include a sacrificial gate liner (not shown), a sacrificial gate 116, and a sacrificial gate cap 118.

The sacrificial gate structures 121 may be formed by initially depositing a sacrificial gate liner layer (e.g., a dielectric, oxide, or the like) upon the one or more STI regions 110 and upon and around the one or more nanolayer stacks 103. The sacrificial gate structures 121 may further be formed by subsequently depositing a sacrificial gate layer (e.g., amorphous silicon, or the like) upon the sacrificial gate liner layer. The thickness of the sacrificial gate layer may be such that the top surface of the sacrificial gate layer is above the top surface of the one or more nanolayer stacks 103. The sacrificial gate structures 121 may further be formed by forming a gate cap layer upon the sacrificial gate layer. The gate cap layer may be formed by depositing a mask material, such as a hard mask material, such as silicon nitride, silicon oxide, combinations thereof, or the like, upon the sacrificial gate layer. The gate cap layer may be composed of one or more layers of masking materials to protect the sacrificial gate layer and/or other underlying materials during subsequent processing of semiconductor IC device 100.

The one or more sacrificial gate structures 121 may further be formed by patterning the gate cap layer, sacrificial gate layer, and sacrificial gate liner by, for example, using lithography and etch processes to remove undesired portions and retain desired portion(s), respectively. The retained desired portion(s) of the gate cap layer, sacrificial gate layer, and sacrificial gate liner may form the sacrificial gate liner (not shown), the sacrificial gate 116, and the sacrificial gate cap 118, respectively, of each of the one or more sacrificial gate structures 121.

One or more sacrificial gate structures 121 can be formed on targeted regions or areas of semiconductor IC device 100 to define the length of one or more GAA FETs and to provide sacrificial material for yielding targeted GAA FET structure(s) in subsequent processing. According to an example, each sacrificial gate structure 121 can have a height of between approximately 50 nm and approximately 200 nm, and a length of between approximately 10 nm and approximately 200 nm.

Figure 5:
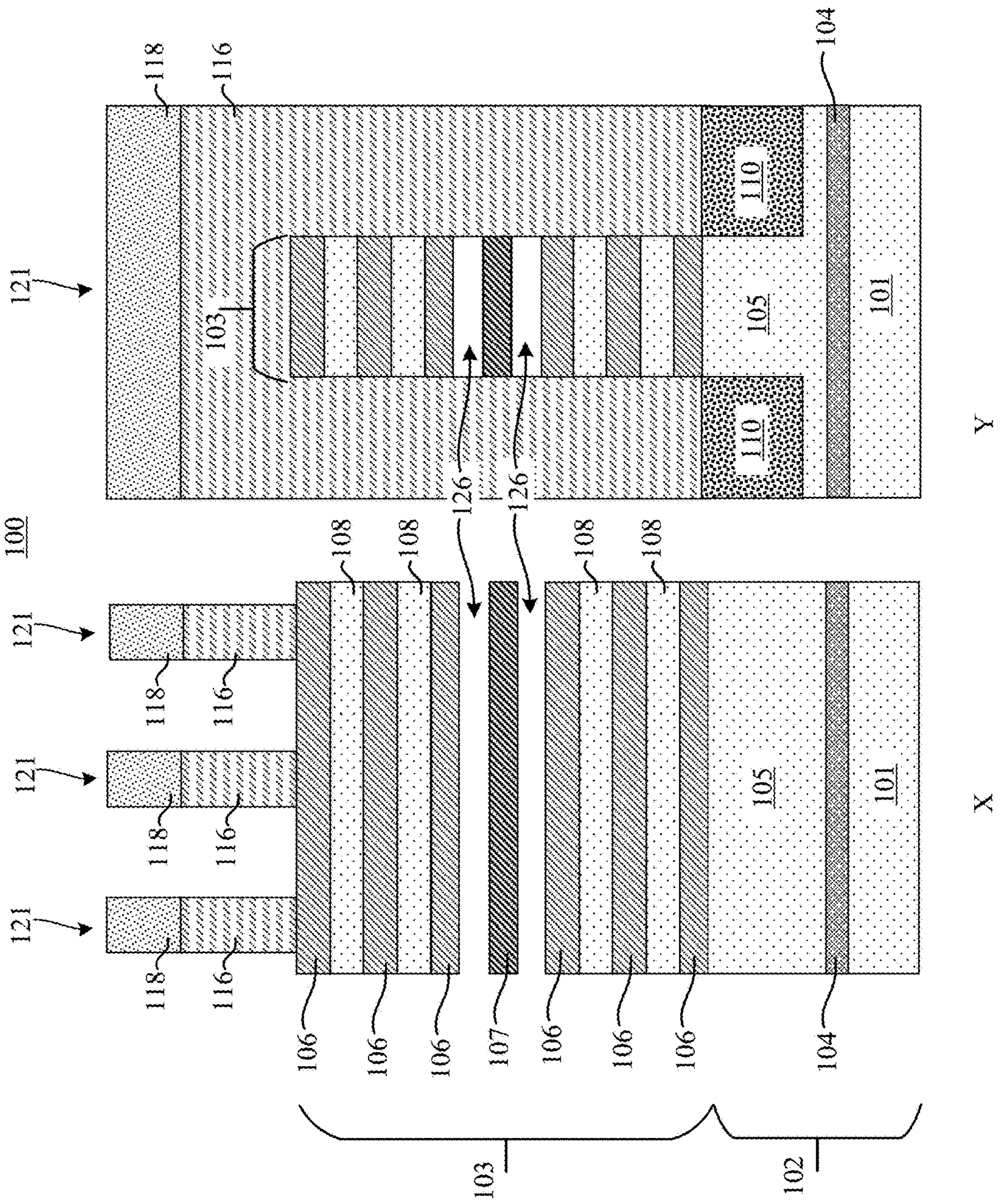

FIG. 5 depicts cross-sectional views of the semiconductor IC device 100 after fabrication operations, in accordance with embodiments of the present disclosure. In the depicted fabrication stages, sacrificial nanolayers 109 are selectively removed.

The sacrificial nanolayers 109 may be selectively removed by a wet etch utilizing an etchant that targets the material sacrificial nanolayers 109 selective to the respective material(s) of the sacrificial nanolayers 106, the sacrificial nanolayer 107, the active nanolayers 108, STI region(s) 110, and sacrificial gate structures 121. The etch may be timed or otherwise controlled to effectively remove the sacrificial nanolayers 109 while substantially retaining the sacrificial nanolayers 106, the sacrificial nanolayer 107, the active nanolayers 108, STI region(s) 110, and sacrificial gate structures 121, etc. As depicted, the removal of sacrificial nanolayers 109 forms one or more respective nanolayer cavities 126 between sacrificial nanolayer 107 and sacrificial nanolayer 106.

Figure 6:
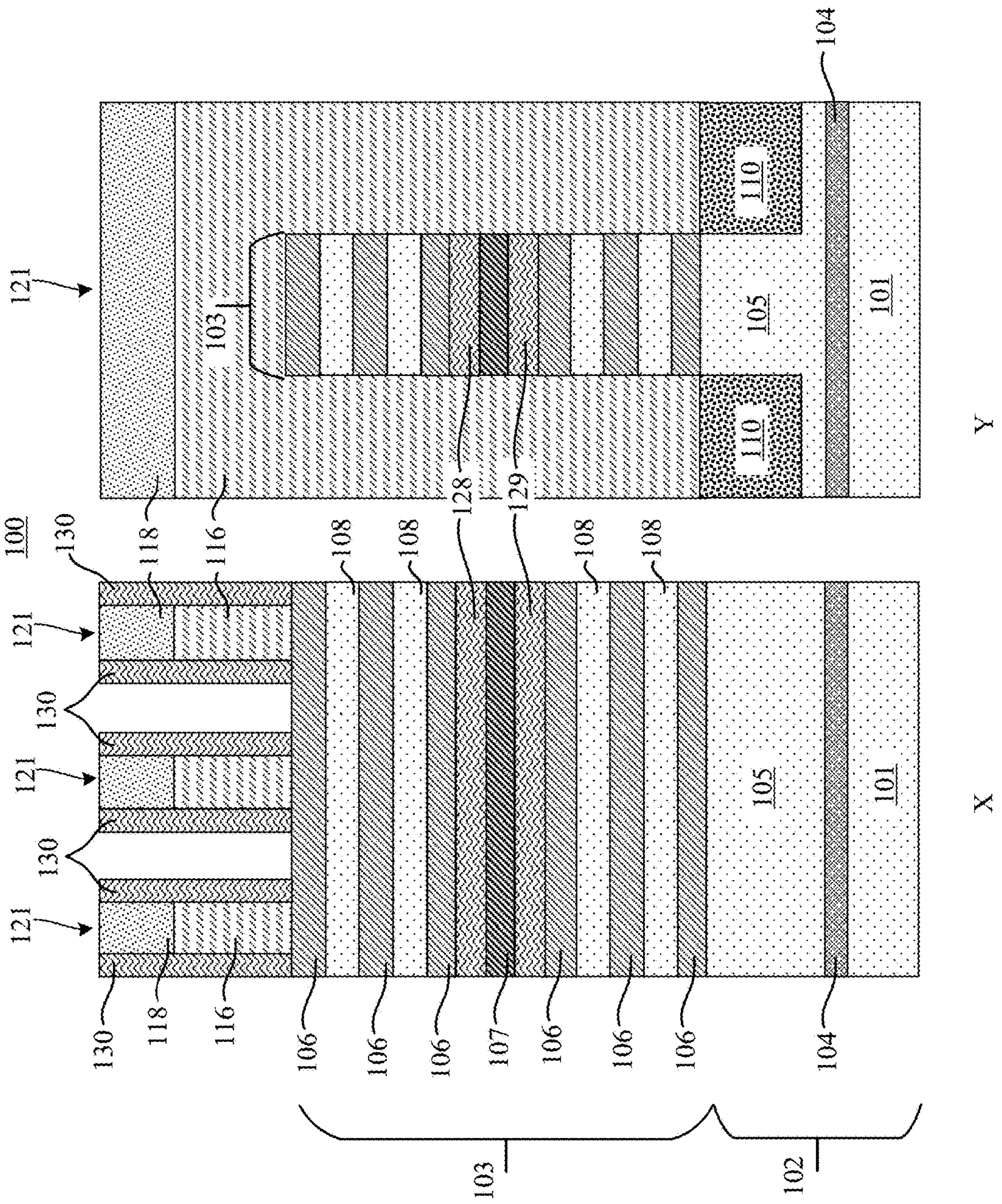

FIG. 6 depicts cross-sectional views of the semiconductor IC device 100 after fabrication operations, in accordance with embodiments of the present disclosure. In the depicted fabrication stages, gate spacers 130, top MDI region 128, and bottom MDI region 129 are formed.

At the present fabrication stage, the top MDI region 128 is between sacrificial nanolayer 107 and the second series of nanolayers and the bottom MDI region 129 is between the same sacrificial nanolayer 107 and the first series of nanolayers. That is, the top MDI region 128 is vertically above the bottom MDI region 129 with the sacrificial nanolayer 107 therebetween.

The top MDI region 128 and the bottom MDI region 129 are formed within a respective nanolayer cavity 126, shown in FIG. 5, within the one or more nanolayer stacks 103. The gate spacer(s) 130 are formed upon the sidewall(s) of the sacrificial gate spacers 121, upon the STI region(s) 110, and around the one or more nanolayer stacks 103.

The top MDI region 128, the bottom MDI region 129, and the gate spacer(s) 130 may be simultaneously formed by a conformal deposition of a dielectric material, such as silicon nitride, SiBCN, SiNC, SiN, SiCO, SiNOC, or a combination thereof, or the like, within the nanolayer cavity 126, upon STI regions 110, upon and around the one or more sacrificial gate structures 121, and upon and around the one or more nanolayer stack(s) 103. Subsequently, undesired portions dielectric material may be removed while desired portions the dielectric material may be retained and thereby form the top MDI region 128, the bottom MDI region 129, and the gate spacer(s) 130. The undesired portions of dielectric material may be removed by a directional ion etch, such as a reactive ion etch (RIE). The RIE may remove exposed or unprotected horizontal portions of the dielectric material while retaining protected horizontal portions of the dielectric layer and vertical portions of the dielectric layer.

Figure 7:
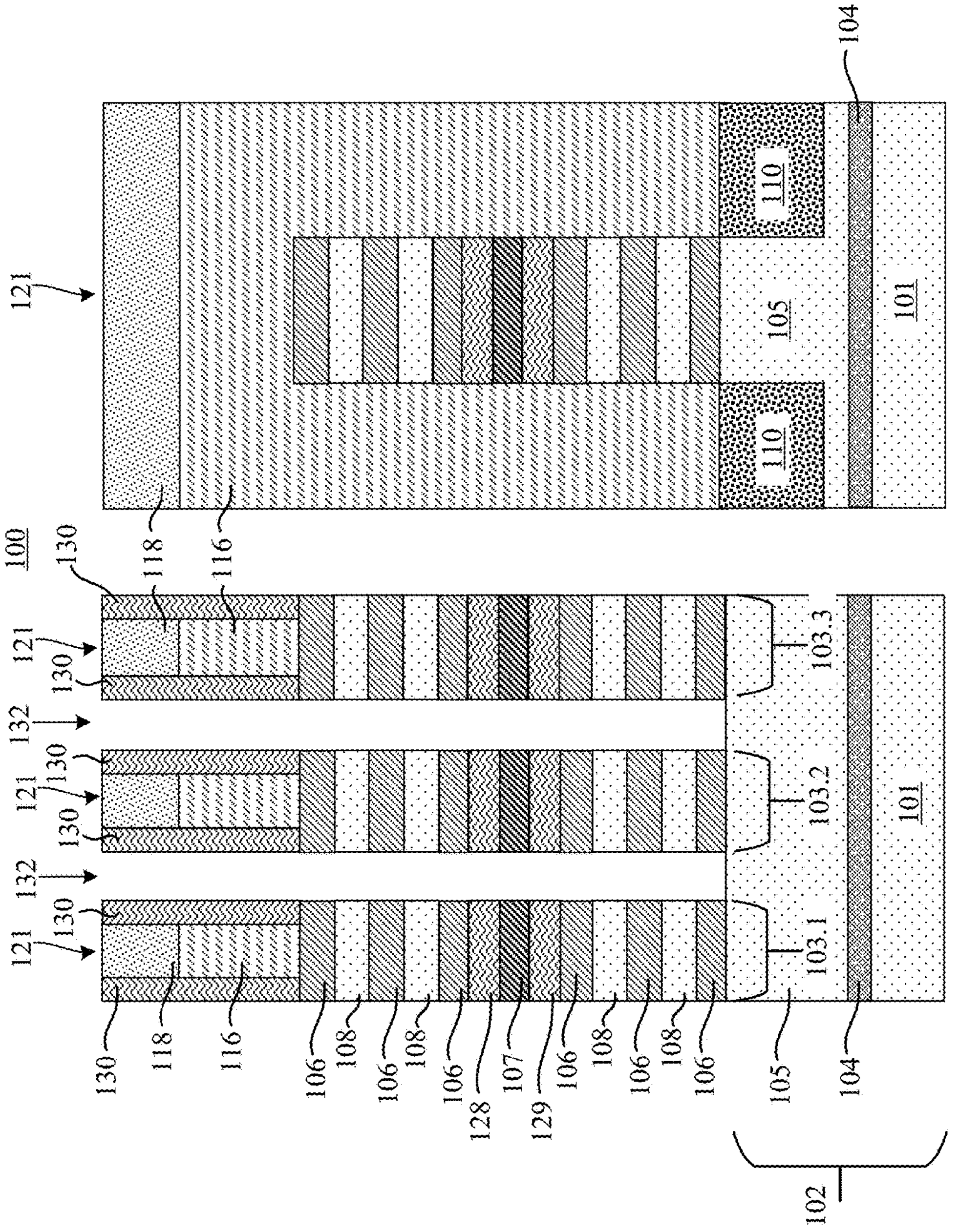

FIG. 7 depicts cross-sectional views of the semiconductor IC device 100 after fabrication operations, in accordance with embodiments of the present disclosure. In the depicted fabrication stages, source/drain (S/D) recesses 132 are formed within the one or more nanolayer stacks 103 between gate spacers 130 that are associated with neighboring sacrificial gate structures 121. In other words, a single nanolayer stack 103 may be separated into multiple nanolayer stacks 103.1, 103.2, 103.3, etc., each located underneath a sacrificial gate structure 121, by the formation of one or more S/D recesses 132.

The one or more S/D recesses 132 may be formed between adjacent sacrificial gate structures 121 by removing respective portions of the sacrificial nanolayers 106, sacrificial nanolayer 107, active nanolayers 108, the top MDI region 128, and the bottom MDI region 129 that are between gate spacers 130 of adjacent or neighboring sacrificial gate structures 121. The one or more S/D recesses 132 may be formed to a depth to stop at the top surface of substrate structure 102 (e.g., the top surface of upper substrate 105, or the like). In the separation of the nanolayer stack 103 into multiple nanolayer stacks 103.1, 103.2, 103.3, etc., respective portions of the sacrificial nanolayers 106, sacrificial nanolayer 107, active nanolayers 108, the top MDI region 128, and the bottom MDI region 129 that are located below the gate spacers 130 and below the sacrificial gate structures 121 may be retained.

The undesired portions of sacrificial nanolayers 106, sacrificial nanolayer 107, active nanolayers 108, top MDI region 128, and the bottom MDI region 129 may be removed by etching or other subtractive removal techniques. The top surface of the substrate structure 102 may be used as an etch stop or other etch parameters may be controlled to stop the material removal at the substrate structure 102. As the gate spacers 130 and the sacrificial gate structures 121 may be utilized to protect the underlying portions of sacrificial nanolayers 106, sacrificial nanolayer 107, active nanolayers 108, the top MDI region 128, and the bottom MDI region 129, respective sidewalls of the nanolayer stacks 103.1, 103.2, 103.3 may be substantially coplanar with the outer sidewalls of the gate spacers 130 thereabove.

Figure 8:
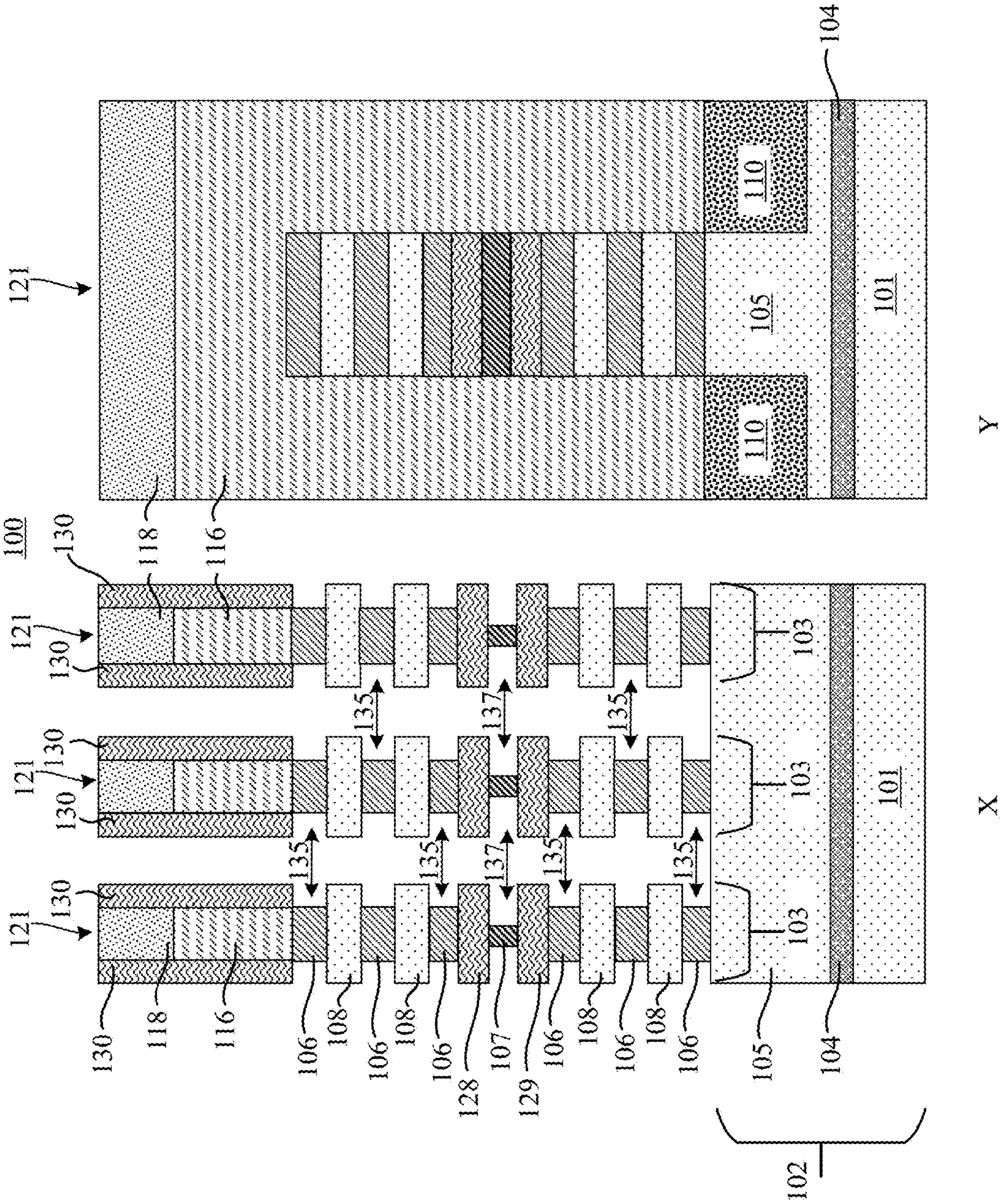

FIG. 8 depicts cross-sectional views of the semiconductor IC device 100 after fabrication operations, in accordance with embodiments of the present disclosure. In the depicted fabrication stages, indents 135 and indents 137 are formed by laterally or horizontally removing respective portions of sacrificial nanolayers 106 and sacrificial nanolayer 107.

Indents 135 and indents 137 may be formed by a reactive ion etch (RIE) process, a wet etch process, which can remove portions of the sacrificial nanolayers 106 and sacrificial nanolayer 107. The horizontal depth of the indents 135 and indents 137 may be chosen to set a length for the replacement gate structure formed in place of the sacrificial gate structure 121. When the sacrificial nanolayers 106 are composed of SiGe, an isotropic etch process can use a boron-based chemistry or a chlorine-based chemistry, for example, which recesses or removes the exposed end portions of sacrificial nanolayers 106 and sacrificial nanolayer 107 (e.g., end portions of sacrificial nanolayers 106 generally below spacer 130 and end portions to a greater horizontal depth or all sacrificial nanolayer 107, etc.) selective to the Si active nanolayers 108. In alternative implementations when sacrificial nanolayers 106 and sacrificial nanolayer 107 are not SiGe and when active nanolayers 108 are not Si, an isotropic etch process of the sacrificial nanolayers 106 and sacrificial nanolayer 107 may generally be selective to the active nanolayers 108, gate spacers 130, STI regions 110, and/or substrate structure 102.

For clarity, the substrative removal of sacrificial nanolayer 107 occurs at a faster rate relative to that of the sacrificial nanolayers 106. As such, the horizontal depth of the indents 137 of sacrificial nanolayer 107 is greater than the horizontal depth of the indents 135 of the sacrificial nanolayers 106. In the depicted example, a portion of the sacrificial nanolayer 107 underneath the sacrificial gate structure 121 is retained and may be utilized to form the semiconductor IC device depicted in FIG. 1. In another example, the entire sacrificial nanolayer 107 is removed and may be utilized to form the semiconductor IC device depicted in FIG. 18. In some implementations, the embodiments of semiconductor IC device 100 depicted in FIG. 1 and in FIG. 18 are combined such that there may be a site where a portion of the sacrificial nanolayer 107, underneath a first sacrificial gate structure 121, is retained while in another site, underneath a second sacrificial gate structure 121, the entire sacrificial nanolayer 107 is removed.

Figure 9:
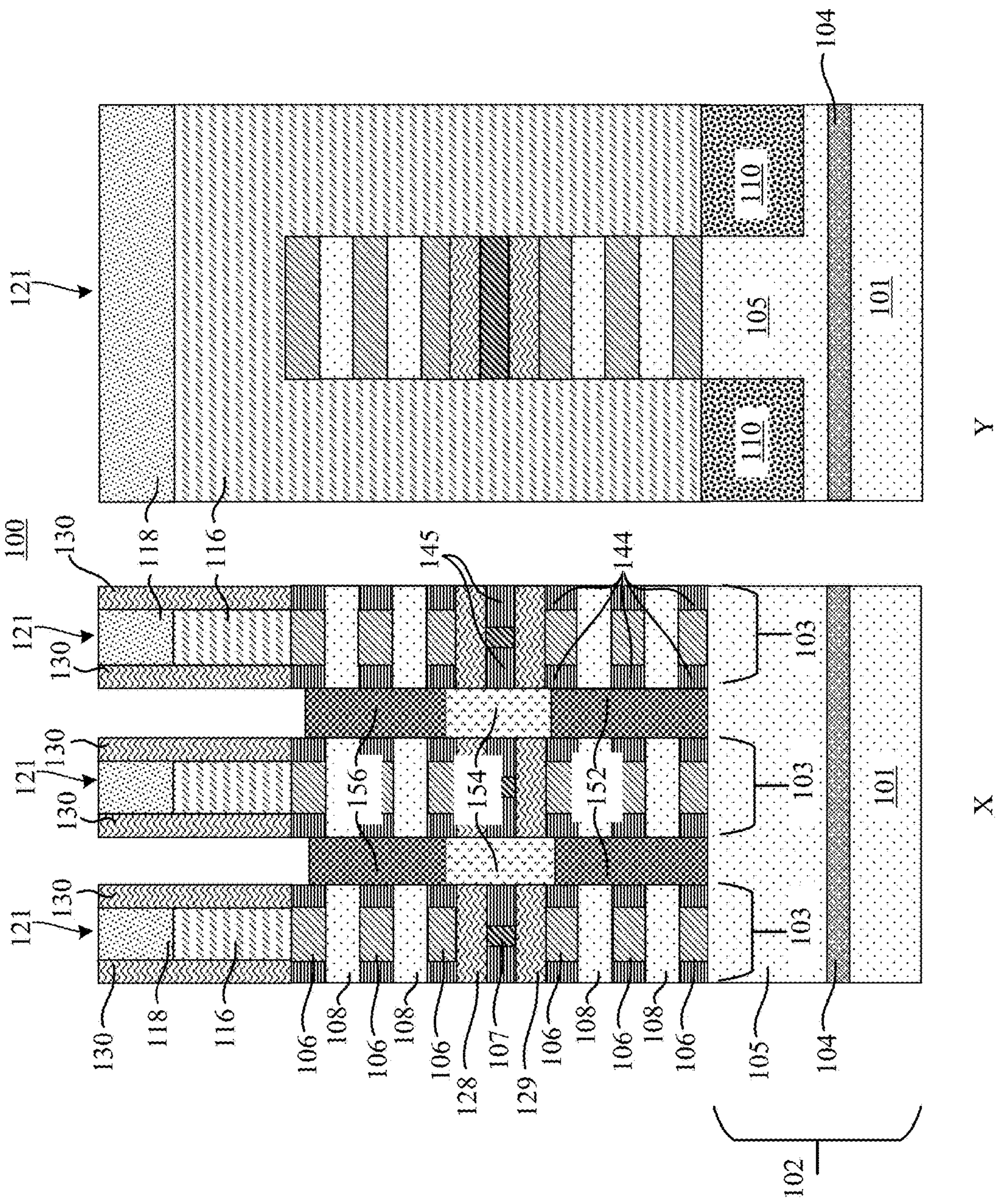

FIG. 9 depicts cross-sectional views of the semiconductor IC device 100 after fabrication operations, in accordance with embodiments of the present disclosure. In the depicted fabrication stages, a respective inner spacer 144 is formed within each of the one or more indents 135 and a respective inner spacer 145 is formed within each of the one or more indents 137. Further in the depicted fabrication stages, one or more bottom S/D regions 152 are formed, one or more S/D isolation regions 154 are formed, and one or more top S/D regions 156 are formed.

The one or more inner spacers 144 and the one or more inner spacers 145 can be simultaneously formed by ALD or CVD or any other suitable deposition technique that deposits a dielectric material within the indents 135 and indents 137, thereby forming the inner spacer(s) 144 and the inner spacer(s) 145. In some examples, the inner spacer(s) 144 and the inner spacer(s) 145 are composed of a low-K dielectric material (a material with a lower dielectric constant relative to $SiO_2$), SiN, SiO, SiBCN, SiOCN, SiCO, etc. or any other suitable dielectric material. In certain implementations, after the formation of the inner spacer(s) 144 and the inner spacer(s) 145, an isotropic etch process is performed to create outer vertical surfaces of the inner spacer(s) 144 and the inner spacer(s) 145 that are coplanar with outer vertical surfaces of the active nanolayers 108 and/or of the gate spacers 130.

Further in the depicted fabrication stages, one or more bottom S/D regions 152 are formed upon the substrate structure 102 and upon sidewalls of neighboring nanolayer stacks 103. Each bottom S/D region 152 forms either a source or a drain, respectively, of respective one or more bottom GAA FETs and is connected to respective side or end surfaces of active nanolayers 108 thereof. Each of the bottom S/D regions 152 is composed of a semiconductor material and a dopant. As used herein, a "source/drain" region can be a source region or a drain region depending on subsequent wiring and application of voltages during operation of the transistor. The semiconductor material that provides each of the bottom S/D regions 152 is composed of one of the semiconductor materials mentioned above for the semiconductor structure 102. The semiconductor material that provides the bottom S/D regions 152 can be compositionally the same, or compositionally different from each active nanolayers 108. The dopant that is present in the bottom S/D regions 152 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. The term "n-type" refers to the addition of impurities that contributes free electrons to an intrinsic semiconductor. In a silicon-containing semiconductor material, examples of n-type dopants, i.e., impurities, include, but are not limited to, antimony, arsenic and phosphorous. In one example, each of the bottom S/D region 152 can have a dopant concentration of from 4×1020 atoms/$cm^3$ to 3×1021 atoms/cm3.

The one or more bottom S/D regions 152 may be epitaxially grown or formed. The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a (100) orientated crystalline surface will take on a (100) orientation. In some embodiments, epitaxial growth and/or deposition processes are selective to forming on semiconductor surfaces, and generally do not deposit material on exposed surfaces, such as silicon dioxide or silicon nitride surfaces. In some examples, the one or more bottom S/D regions 152 are formed by in-situ doped epitaxial growth. The use of an in-situ doping process is merely an example. For instance, one may instead employ an ex-situ process to introduce dopants into the source and drains. Other doping techniques can be used to incorporate dopants in the bottom source/drain region. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. In examples, the S/D epitaxial growth conditions promote in-situ Boron doped SiGe for p-type transistor and phosphorus or arsenic doped silicon or Si:C for n-type transistors.

In some examples, the S/D epitaxial growth that forms the one or more bottom S/D region 152 occurs or is promoted from the top surface of upper substrate 105 while epitaxial growth is limited or does not occur from neighboring STI regions 110.

In some embodiments, the one or more bottom S/D region 152 epitaxial growth may overgrow above the upper surface of the semiconductor IC device 100 and be subsequently recessed such that the top surface of the bottom S/D region 152 is coplanar with or below the top surface of the bottom MDI region 129 and above the top surface of the topmost active nanolayer 108 within the first series of nanolayers.

Further in the depicted fabrication stage, a S/D isolation region 154 is formed upon a respective bottom S/D region 152. As depicted in the X-view, the S/D isolation region 154 may be formed upon the respective bottom S/D region 152 and in between and in contact with sidewalls or end surfaces of the bottom MDI region 129, the inner spacer(s) 145, and the top MDI region 128. The S/D isolation region(s) 154 may be formed to a thickness between the top surface of top MDI region 128 and a bottom surface of the bottom most active nanolayer 108 within the second series of nanolayers.

The S/D isolation region(s) 154 may be formed by depositing a blanket dielectric material, followed by CMP and recess. The S/D isolation region(s) 154 can be any suitable material, such as, for example, porous silicates, carbon doped oxides, silicon dioxides, silicon nitrides, silicon oxynitrides, organic planarization material (OPL), or other dielectric materials. Any known manner of forming the S/D isolation region(s) 154 can be utilized. The S/D isolation region(s) 154 can be formed using, for example, CVD, PECVD, ALD, flowable CVD, spin-on dielectrics, or PVD.

In an example, the S/D isolation region(s) 154 may be formed to a thickness above the top surface of the sacrificial gate structures 121. Subsequently, an etch may be performed to remove the S/D isolation region(s) 154 so that the top surface of the S/D isolation region(s) 154 is above the top surface of top MDI region 128.

The dual MDI structure of the bottom MDI region 129 and the top MDI region 128 influences the thickness of the S/D isolation region 154 that separates the top FET (e.g., S/D region 156 of the top FET) and the bottom FET (e.g., bottom S/D region 152 of the bottom FET). In other words, the vertical dimension between the top surface of the top MDI region 128 and the bottom surface of the bottom MDI region 129 influences the thickness (e.g., thickness t.1 as depicted in FIG. 1) of the S/D isolation region 154 which may be greater relative to an equivalent thickness of an S/D isolation region that is associated with a single MDI region. In this manner, the dual MDI structure advantageously provides for relatively increased separation between the top FET and the bottom FET.

The dual MDI structure increases the process margin associated with process variation control of the formation of the S/D isolation region(s) 154. For example, the dual MDI structure improves CMP center/edge uniformity, ILD recess non-uniformity, etc. as opposed to a single layer MDI where such process margins are relatively smaller.

Further in the depicted fabrication stage, top S/D region 156 is formed upon a respective S/D isolation region 154. The one or more top S/D regions 156 are further formed upon sidewalls of neighboring nanolayer stacks 103. Each top S/D region 156 forms either a source or a drain, respectively, of respective one or more top GAA FETs and is connected to respective side or end surfaces of active nanolayers 108 thereof. Each of the top S/D region 156 is composed of a semiconductor material and a dopant. The semiconductor material that provides each of the top S/D region 156 is composed of one of the semiconductor materials mentioned above for the semiconductor structure 102. The semiconductor material that provides the top S/D region 156 can be compositionally the same, or compositionally different from each active nanolayers 108. The dopant that is present in the top S/D region 156 can be either a p-type dopant or an n-type dopant. In one example, the top S/D region 156 can have a dopant concentration of from 4×1020 atoms/$cm^3$ to $3\times10^{21}$ atoms/$cm^3$.

The one or more top S/D regions 156 may be epitaxially grown or formed. In some examples, the one or more top S/D region 156 are formed by in-situ doped epitaxial growth. The use of an in-situ doping process is merely an example. For instance, one may instead employ an ex-situ process to introduce dopants into the source and drains. Other doping techniques can be used to incorporate dopants in the top S/D region 156. As depicted in the X-view, the top S/D region 156 may be formed upon the respective S/D isolation region 154 and in between and in contact with sidewalls or end surfaces of the inner spacer(s) 144 and active nanolayers 108 within the second series of nanolayers. The top S/D region 156 may be formed to a thickness above the top surface of the topmost active nanolayer 108 within the second series of nanolayers.

Figure 10:
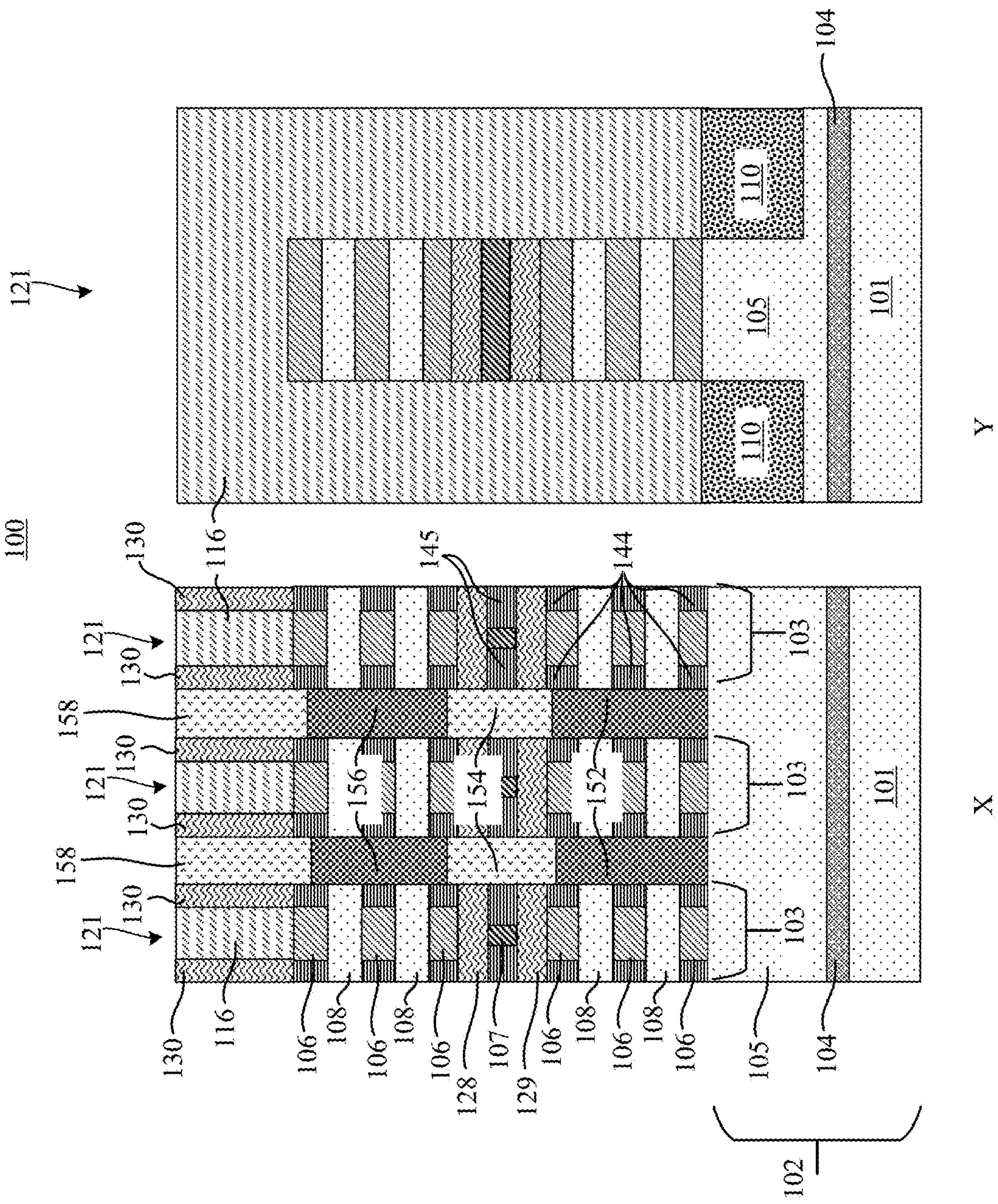

FIG. 10 depicts cross-sectional views of the semiconductor IC device 100 after fabrication operations, in accordance with embodiments of the present disclosure. In the depicted fabrication stages, an interlayer dielectric (ILD) 158 is formed. For example, ILD 158 may be formed upon the top S/D region(s) 156 and upon at least the sidewalls of the sacrificial gate structures 121.

The ILD 158 may be formed by depositing a blanket dielectric material. The ILD 158 can be any suitable material, such as, for example, porous silicates, carbon doped oxides, silicon dioxides, silicon nitrides, silicon oxynitrides, organic planarization material (OPL), or other dielectric materials. Any known manner of forming the ILD 158 can be utilized. The ILD 158 can be formed using, for example, CVD, PECVD, ALD, flowable CVD, spin-on dielectrics, or PVD.

In an example, the ILD 158 may be formed to a thickness above the top surface of the sacrificial gate structures 121. Subsequently, a planarization process, such as a CMP, may be performed to remove the sacrificial gate cap 118, to partially remove the excess ILD 158, and to partially remove the gate spacers 130. The planarization may also partially remove some of the sacrificial gate 116 or may at least expose the sacrificial gate 116 of the sacrificial gate structures 121. The CMP may create a planar or horizontal top surface for the semiconductor IC device 100. In other words, the respective top surfaces of ILD 158, gate spacers 130, and sacrificial gates 116 may be coplanar.

Figure 11:
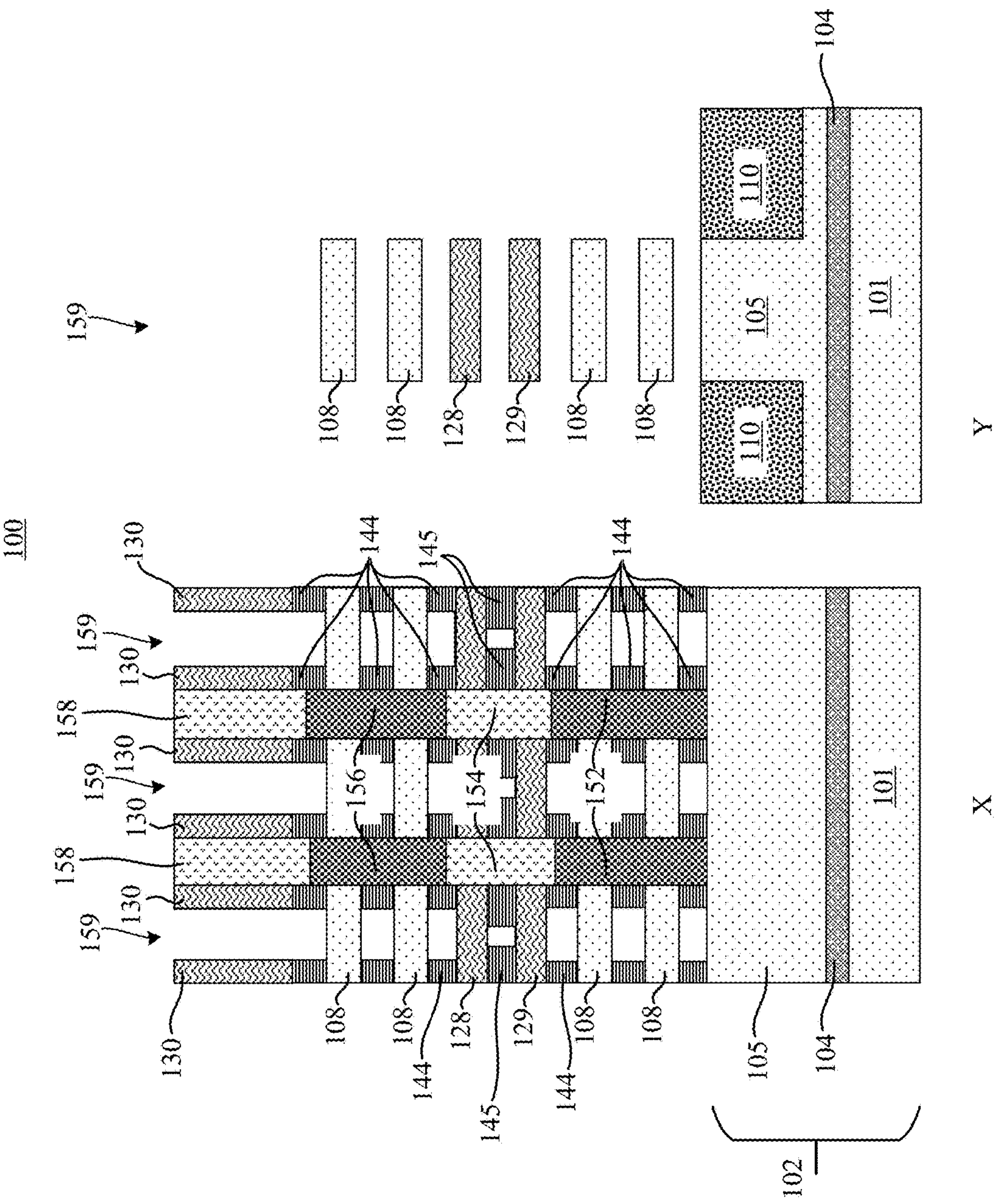

FIG. 11 depicts cross-sectional views of the semiconductor IC device 100 after fabrication operations, in accordance with embodiments of the present disclosure. In the depicted fabrication stages, the sacrificial gate structures 121 are removed thereby partially forming respective replacement gate openings 159.

The sacrificial gate structure 121 may be removed by initially removing the sacrificial gate 116 and sacrificial gate oxide by a removal technique, such as one or more series of etches. For example, such removal may be accomplished by an etching process which may include a dry etching process such as RIE, plasma etching, ion etching or laser ablation. The etching can further include a wet chemical etching process in which one or more chemical etchants are used to remove the sacrificial gate 116 and sacrificial gate oxide of the sacrificial gate structures 121. Appropriate etchants may be used that remove the sacrificial gate 116 and/or sacrificial gate oxide selective to the active nanolayers 108, inner spacers 144, inner spacers 145, gate spacers 130, STI regions 110, and substrate structure 102, or the like.

The replacement gate openings 159 may be further formed by releasing the active nanolayers 108 by removing the sacrificial nanolayers 106 and by removing the sacrificial nanolayer 107 (if present).

The sacrificial nanolayers 106 and the sacrificial nanolayer 107 may be removed by a removal technique, such as one or more series of etches. For example, the etching can include a wet chemical etching process in which one or more chemical etchants are used to remove the sacrificial nanolayers 106 and the sacrificial nanolayer 107. Appropriate etchants may be used that remove the sacrificial nanolayers 106 and the sacrificial nanolayer 107 selective to the active nanolayers 108, inner spacers 144, inner spacers 145, gate spacers 130, or the like. After the removal of sacrificial nanolayers 106, there are void spaces between the active nanolayers 108. After the removal of sacrificial nanolayer 107, there is a void space vertically between the bottom MDI region 129 and the top MDI region 128 and horizontally between the inner spacers 145.

Figure 12:
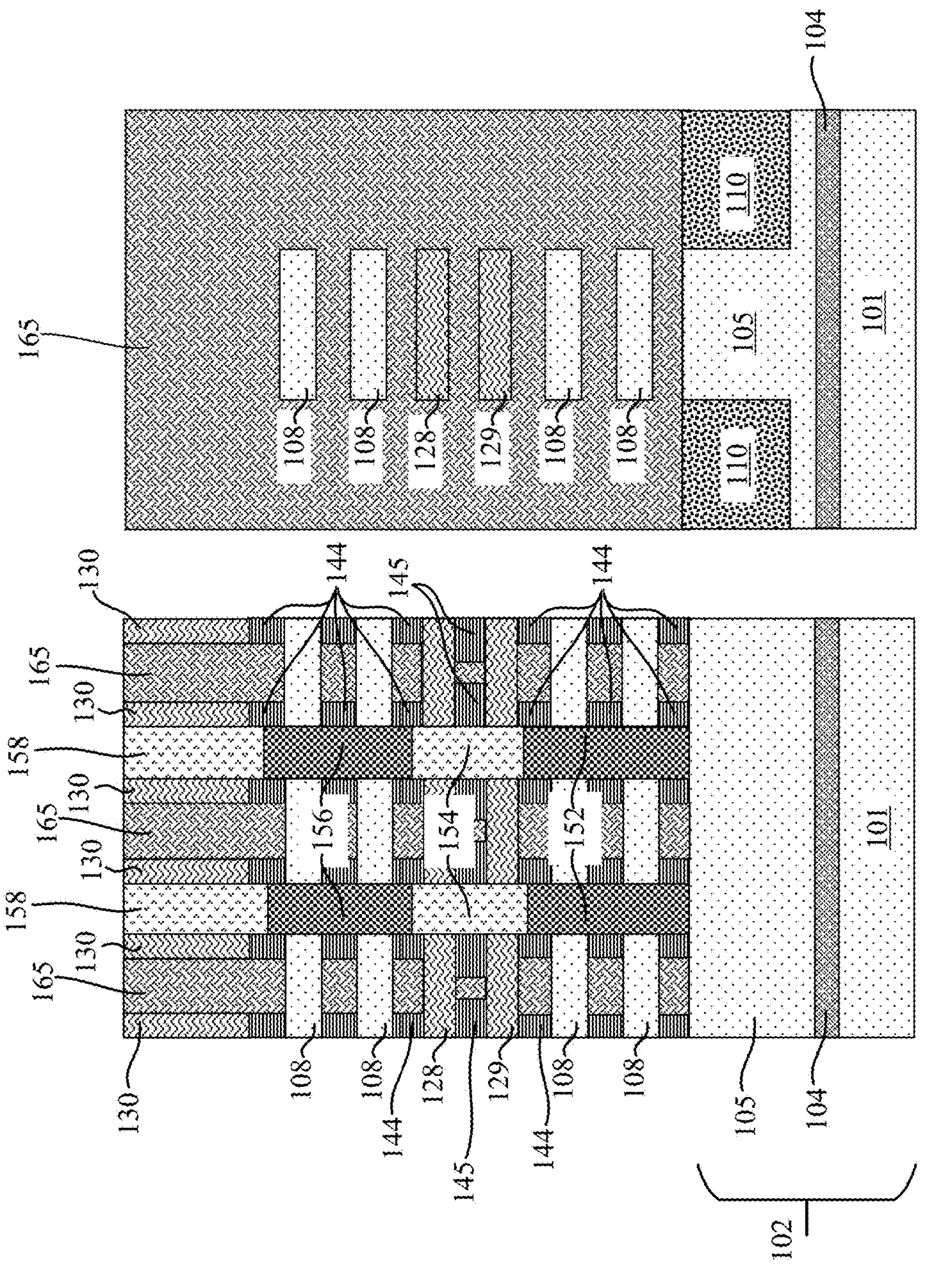

FIG. 12 depicts cross-sectional views of the semiconductor IC device 100 after fabrication operations, in accordance with embodiments of the present disclosure. In the depicted fabrication stages, a replacement gate structure 165 is formed within the replacement gate openings 159 in place of the removed sacrificial gate structures 121 around the active nanolayers 108, around the bottom MDI region 129, and around the top MDI region 128.

Replacement gate structure(s) 165 may be formed by initially forming an interfacial layer on the gate spacer 130, on the active nanolayers 108, on the bottom MDI region 129, on the top MDI region 128, and on the inner spacers 144, etc. that are interior to and/or upon the respective surfaces interior to the replacement gate opening(s) 159. The interfacial layer can be deposited by any suitable techniques, such as ALD, CVD, PVD, thermal oxidation, combinations thereof, or other suitable techniques.

Replacement gate structure(s) 165 may be further formed by forming a high-K layer to cover the exposed surfaces of the interfacial layer. The high-layer can be deposited by any suitable techniques, such as ALD, CVD, metal-organic CVD (MOCVD), PVD, thermal oxidation, combinations thereof, or other suitable techniques. A high-K material is a material with a higher dielectric constant than that of $SiO_2$, and can include e.g., LaO, AlO, ZrO, TiO, $Ta_2O_5$, $Y_2O_3$, $SrTiO_3$ (STO), $BaTiO_3$(BTO), BaZrO, HfZrO, HfLaO, HfSiO, LaSiO, AlSiO, HfTaO, HfTiO, (Ba,Sr)$TiO_3$ (BST), $Al_2O_3$, $Si_3N_4$, oxynitrides (SiON), or other suitable materials. The high-K layer can include a single layer or multiple layers, such as metal layer, liner layer, wetting layer, and adhesion layer. In other embodiments, the high-K layer 140 can include, e.g., Ti, Ag, Al, TiAlN, TaC, TaCN, TaSiN, Mn, Zr, TiN, TaN, Ru, Mo, Al, WN, Cu, W, or any suitable materials.

Replacement gate structure(s) 165 may be further formed by depositing a work function (WF) gate upon the high-K layer. The WF gate can be comprised of a conductor or metal, such as, e.g., copper (Cu), cobalt (Co), aluminum (Al), platinum (Pt), gold (Au), tungsten (W), titanium (Ti), nitride (N) or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. In general, the WF gate sets the threshold voltage (Vt) of the device. The high-K layer may separate the WF gate from the nanolayer channel (i.e., active nanolayer 108). Other metals that may be desired to further fine tune the effective work function (eWF) and/or to achieve a desired resistance value associated with current flow through the gate in the direction parallel to the plane of the nanolayer channel.

The one or more replacement gate structures 165 may be further formed by depositing a conductive fill gate upon the WF gate. The conductive fill gate can be comprised of metals, such as but not limited to, e.g., tungsten, aluminum, ruthenium, rhodium, cobalt, copper, tantalum, titanium, carbon nanowire materials including graphene, or the like. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. After the replacement gate structure 165 formation, the top surface of the semiconductor IC device 100 may be planarized by a planarization technique such as a CMP, mechanical grinding process, or the like. After the planarization technique, respective top surfaces of the ILD 158, gate spacers 130, replacement gate structure(s) 165, may be substantially horizontal and/or may be substantially coplanar.

Figure 13:
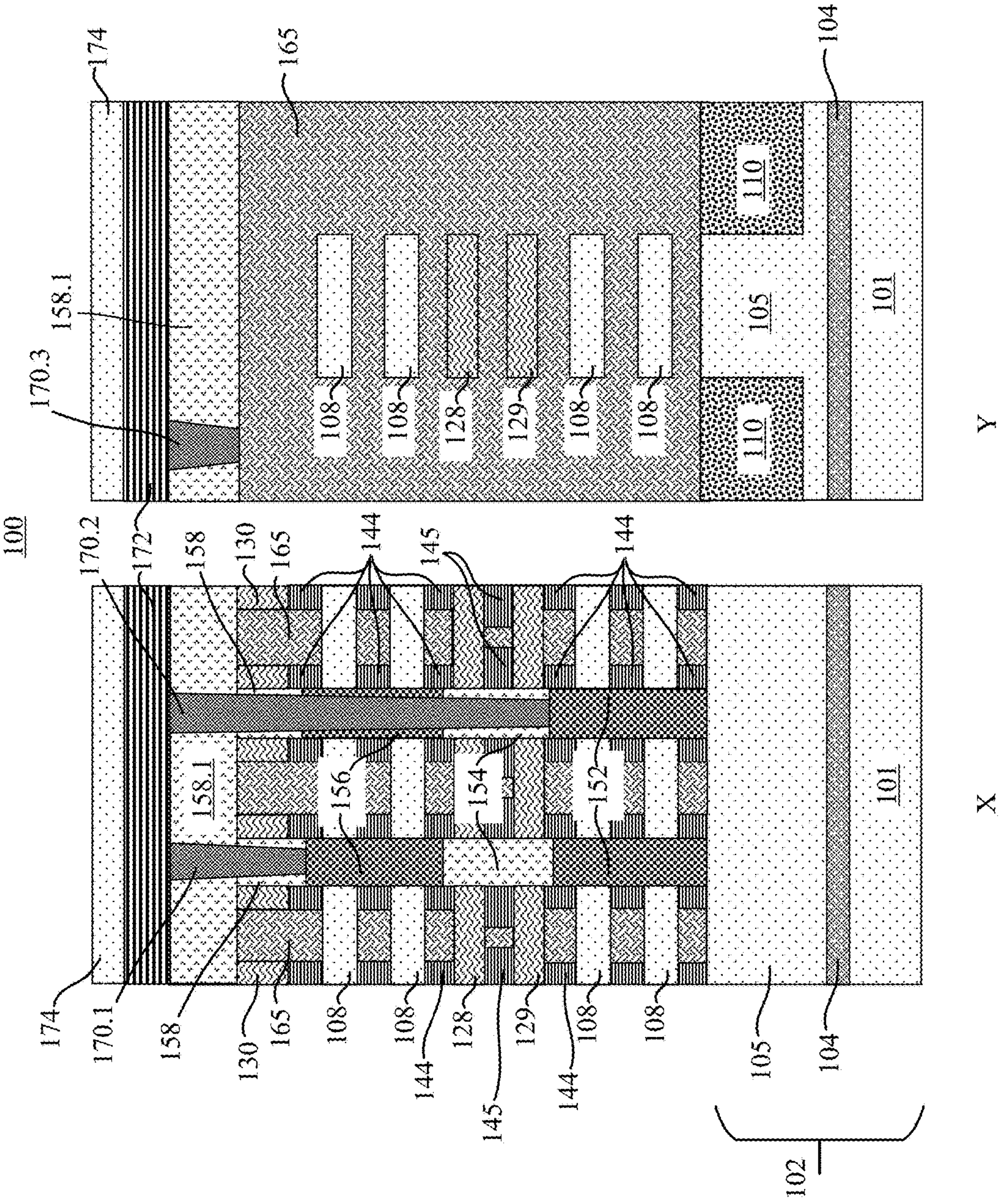

FIG. 13 depicts cross-sectional views of the semiconductor IC device 100 after fabrication operations, in accordance with embodiments of the present disclosure. In the depicted fabrication stages, ILD 158.1 is formed, one or more frontside contact(s) 170 (e.g., frontside contact 170.1, 170.2, 170.3, etc.) are formed, a frontside back end of line (BEOL) network 172 is formed, and a carrier wafer 174 is attached.

The ILD 158.1 may be formed upon respective top surfaces of replacement gate structure 165 and ILD 158. The ILD 158.1 may be formed by depositing a dielectric material, such as, for example, porous silicates, carbon doped oxides, silicon dioxides, silicon nitrides, silicon oxynitrides, or other dielectric materials. Any appropriate deposition technique for forming the ILD 158.1 can be utilized. The ILD 158.1 can be formed using, for example, CVD, PECVD, ALD, flowable CVD, spin-on dielectrics, or PVD.

The frontside contact(s) 170 may be formed by patterning respective frontside contact openings within ILD 158.1, ILD 158, or the like, from the frontside (i.e., from above the semiconductor IC device, as depicted, downward to respective structures thereof). The frontside contact(s) 170 may be in direct or indirect physical and electrical contact and/or may physically meld with respective material(s) of one or more regions of the semiconductor IC device 100. For example, frontside contact 170.1 is in direct contact with top S/D region 156. Similarly, frontside contact 170.2 is in direct contact with top S/D region 156, extends through S/D isolation region 154, and is in direct contact with bottom S/D region 152. Likewise, frontside contact 170.3 is in direct contact with replacement gate structure 165.

The frontside contact(s) 170 may be formed by initially forming frontside contact opening(s). The frontside contact opening(s) may be formed by the same or shared lithography and etch process(es), or sequential lithography and etch processes. In such process(es), a mask may be applied and patterned. An opening in the patterned mask may expose the portion of the underlying ILD 158.1 to be removed while other protected portions of semiconductor IC device 100 thereunder may be protected and retained. In such process (es), the dry and wet etching processes can have etching parameters that can be tuned, such as etchants used, etching temperature, etching solution concentration, etching pressure, source power, RF bias voltage, RF bias power, etchant flow rate, to promote desired material removal and desired material retention.

The frontside contact(s) 170 may be further formed by depositing conductive material such as metal into the respective frontside contact opening(s). In an example, frontside contact(s) 170 may be formed by depositing a silicide liner, such as Ni, NiPt or Ti, etc. into the contact opening(s), depositing a metal adhesion liner, such as TiN, TaN, etc. upon the silicide liner, and by depositing a conductive metal fill, such as Al, Ru, W, Co, Cu, etc. upon the metal adhesion liner. Subsequently, a planarization process, such as a CMP process or a mechanical grinding process, may remove excess portions of the conductive barrier layer and the conductive material. Subsequently, the respective top surfaces of frontside contact(s) 170 and ILD 158.1 may be coplanar.

In the semiconductor IC device fabrication industry, there are three sections referred to in a build: front-end-of-line (FEOL), back-end-of-line (BEOL), and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices.

Figure 16:
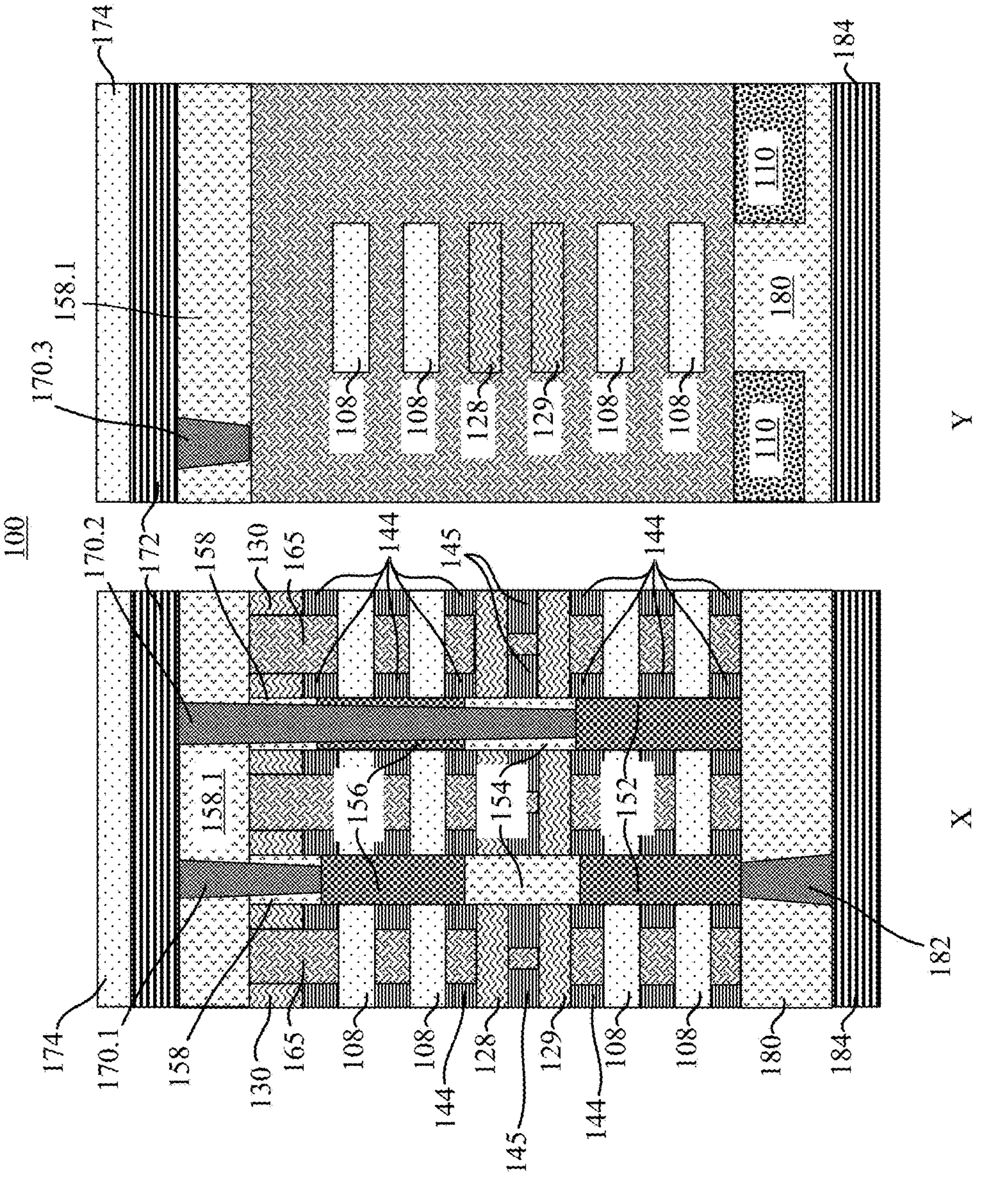

BEOL is the second portion of IC fabrication where the individual devices (e.g., transistors, capacitors, resistors, etc.) become interconnected with wiring on the wafer, e.g., the metallization layer or layers. BEOL includes contacts, insulating layers (dielectrics), metal levels, and bonding sites for chip-to-package connections. In the BEOL, part of the fabrication stage contacts (pads), interconnect wires, vias and dielectric structures are formed. For modern IC processes, more than metal layers may be added in the BEOL. In the present example, there are multiple BEOL structures. First, a frontside BEOL network 172 is formed on the frontside of the semiconductor device 100. Subsequently, a backside BEOL network 184, as depicted in FIG. 16 is formed.

In the depicted example, the frontside BEOL network 172 is formed over the ILD 158 and upon the frontside contacts 170. The frontside BEOL network 172 may be indirectly electrically and/or physically connected to the one or more bottom S/D regions 152, one or more top S/D regions 156, and/or one or more replacement gate structures 165 by a one or more frontside contacts 170. The frontside BEOL network 172 is located directly on the frontside surface of the MOL structure (e.g., ILD 158.1, frontside contacts 170, etc.). The frontside BEOL network 172 can include one or more interconnect dielectric material layers (including one of the dielectric materials mentioned above for the frontside ILD 158) and contains frontside metal wires (the metal wires can be composed of any electrically conductive metal or electrically conductive metal alloy) embedded therein. In some embodiments, the frontside metal wires within the frontside BEOL network 172 are composed of Cu. The frontside BEOL network 172 can include "x" numbers of frontside metal levels, wherein "x" is an integer starting from 1. The frontside BEOL network 172 may further contain conductive pads that are connected to one or more of the metal wires and may be used to connect the semiconductor IC device to a external and/or higher-level structure, such as a chip carrier, motherboard, or the like.

The carrier wafer 174 can include one of the semiconductor materials mentioned above for the semiconductor structure 102. Carrier wafer 174 may be attached to the semiconductor IC device 100 by a wafer-to-wafer bonding technique.

Figure 14:
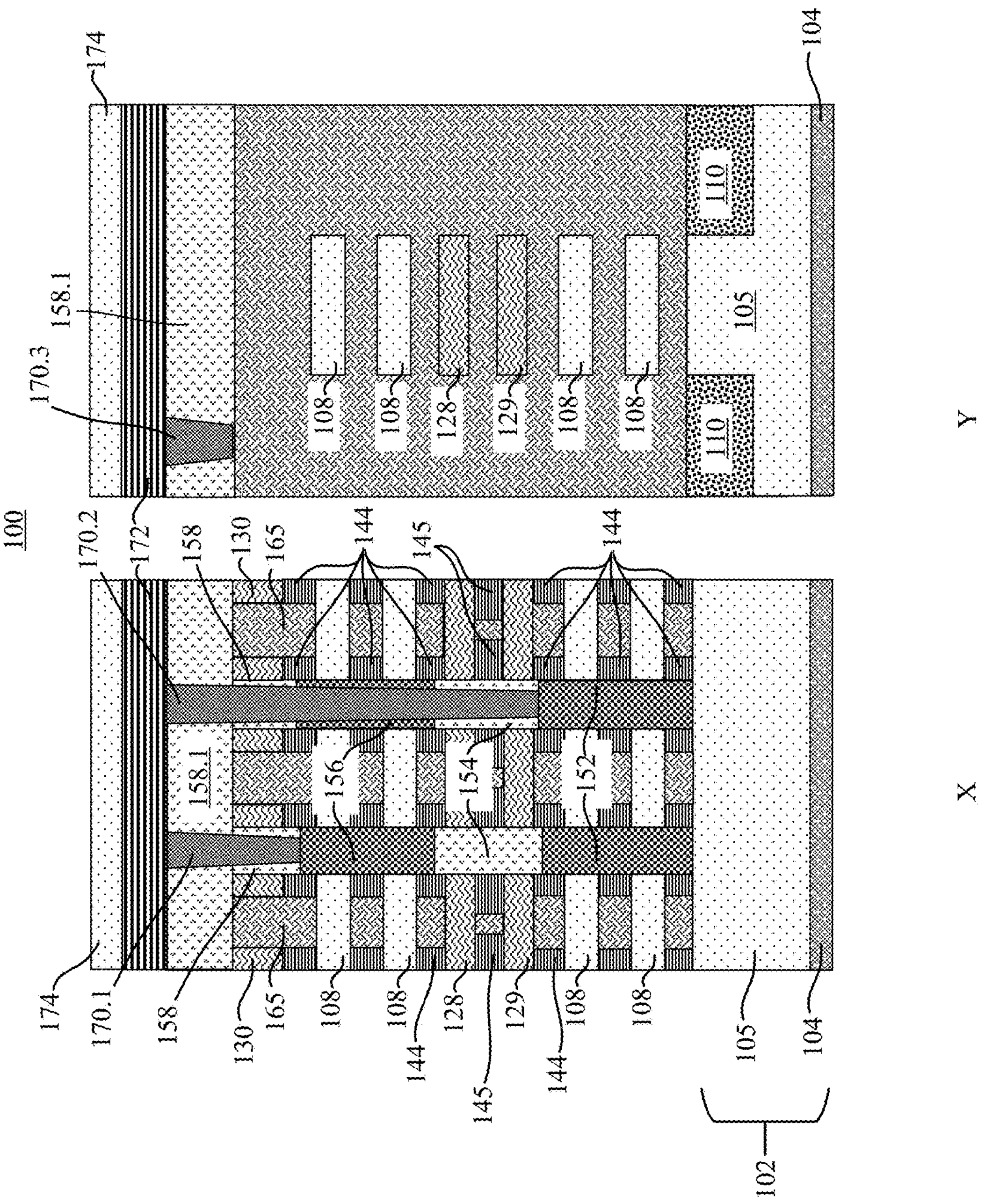

FIG. 14 depicts cross-sectional views of the semiconductor IC device 100 after fabrication operations, in accordance with embodiments of the present disclosure. In the depicted fabrication stages, substrate structure 102 may be recessed. For example, lower substrate 101 may be removed.

The substrate structure 102 may be recessed by flipping the semiconductor IC device 100 (not shown) and removing the lower substrate 101 using any removal technique, such as a combination of wafer grinding, CMP, dry, and/or wet etch. In the example depicted, lower substrate 101 is removed by an etch that utilizes etch stop layer 104 as the etch stop. In this example, removal of lower substrate 101 exposes the bottom surface of etch stop layer 104.

Figure 15:
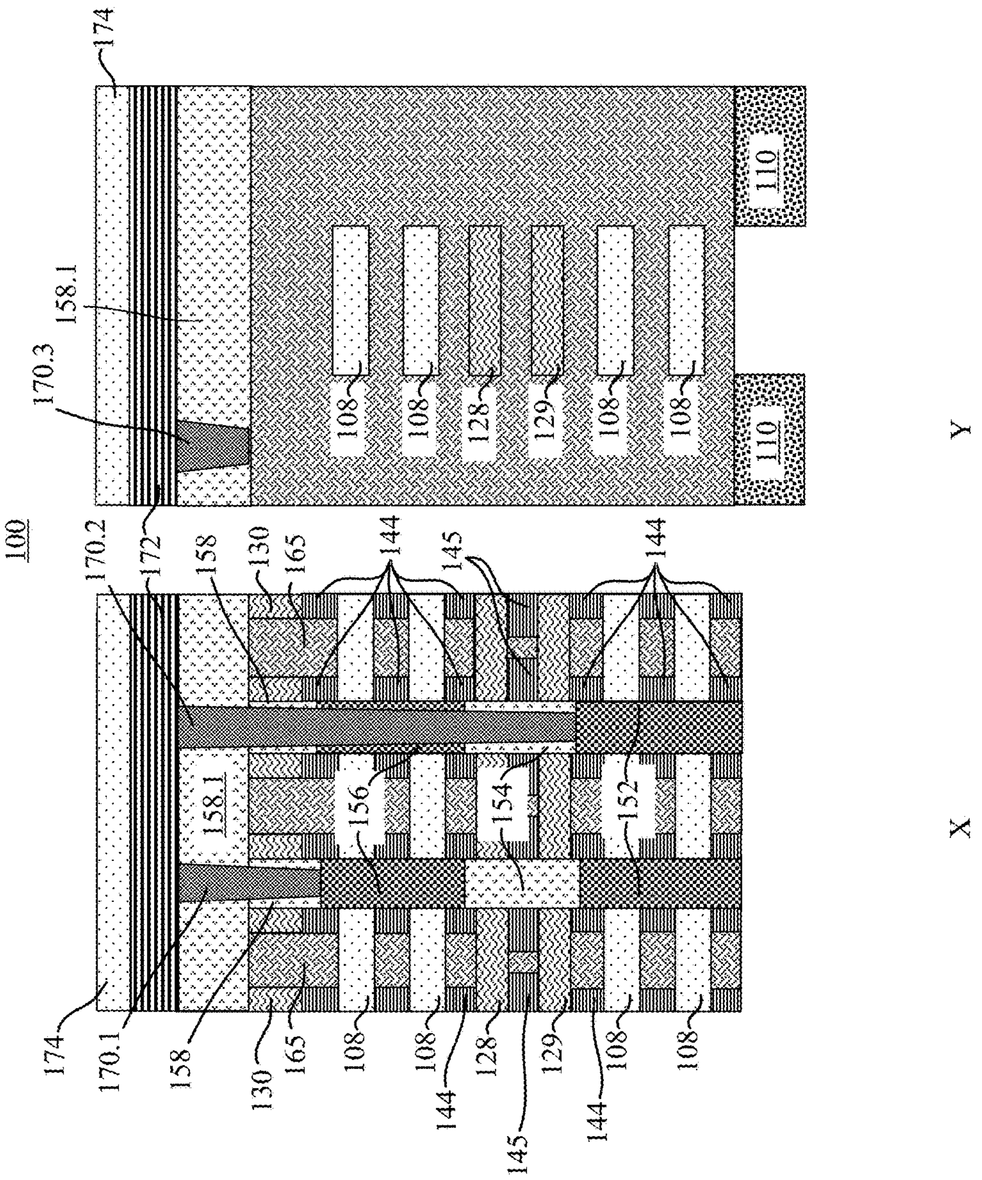

FIG. 15 depicts cross-sectional views of the semiconductor IC device 100 after fabrication operations, in accordance with embodiments of the present disclosure. In the depicted fabrication stages, substrate structure 102 may be removed. For example, etch stop layer 104 and the upper substrate 105 may be removed.

The etch stop layer 104 may be removed by a subtractive removal technique such as a CMP, dry and/or wet etch. Upon removal of the etch stop layer 104, the bottom surface of upper substrate 105 is exposed. The removal of etch stop layer 104 may be selective to the material of upper substrate 105. For example, etch stop layer 104 is removed by an etch that utilizes upper substrate 105 as the etch stop.

Subsequently, the upper substrate 105 is removed by an appropriate substrative removal technique, such as an etch, that removes associated portion(s) of the upper substrate 105. The etch may be timed or otherwise controlled to remove the material of substrate 105 and retain or otherwise expose the STI regions 110, retain and partially expose the one or more bottom S/D regions 152, retain and expose at least a portion of respective bottom surfaces of replacement gate structure(s) 165 and inner spacers 144.

FIG. 16 depicts cross-sectional views of semiconductor IC device 100 shown after exemplary fabrication operation (s), in accordance with one or more embodiments. In the depicted fabrication stage, ILD 180 is formed upon the exposed backside of the semiconductor IC device 100, one or more backside contacts 182 are formed, and a backside BEOL network 184 is formed.

The ILD 180 may be formed upon and around the exposed STI regions 110, formed upon and around the partially exposed one or more bottom S/D regions 152, and formed upon the exposed portion of respective bottom surfaces of replacement gate structure(s) 165 and inner spacers 144. The ILD 180 may be formed by depositing a dielectric material, such as, for example, porous silicates, carbon doped oxides, silicon dioxides, silicon nitrides, silicon oxynitrides, or other dielectric materials. Any appropriate deposition technique for forming the ILD 180 can be utilized. The ILD 180 can be formed using, for example, CVD, PECVD, ALD, flowable CVD, spin-on dielectrics, or PVD.

The one or more backside contacts 182 may be formed by patterning respective backside contact openings within ILD 180, or the like, from the backside (i.e., from below the semiconductor IC device, as depicted, upward to respective structures thereof). The backside contact(s) 182 may be in direct or indirect physical and electrical contact and/or may physically meld with respective material(s) of one or more regions of the semiconductor IC device 100. For example, the depicted frontside contact 182 is in direct contact with bottom S/D region 152.

The backside contact(s) 182 may be formed by initially forming backside contact opening(s). The backside contact opening(s) may be formed by the same or shared lithography and etch process(es), or sequential lithography and etch processes. In such process(es), a mask may be applied to the backside of the ILD 180 and patterned. An opening in the patterned mask may expose the portion of the underlying ILD 180 to be removed while other protected portions of semiconductor IC device 100 thereunder may be protected and retained. In such process(es), the dry and wet etching processes can have etching parameters that can be tuned, such as etchants used, etching temperature, etching solution concentration, etching pressure, source power, RF bias voltage, RF bias power, etchant flow rate, to promote desired material removal and desired material retention.

The backside contact(s) 182 may be further formed by depositing conductive material such as metal into the respective backside contact opening(s). In an example, backside contact(s) 182 may be formed by depositing a silicide liner, such as Ni, NiPt or Ti, etc. into the backside contact opening(s), depositing a metal adhesion liner, such as TiN, TaN, etc. upon the silicide liner, and by depositing a conductive metal fill, such as Al, Ru, W, Co, Cu, etc. upon the metal adhesion liner. Subsequently, a planarization process, such as a CMP process or a mechanical grinding process, may remove excess portions of the conductive barrier layer and the conductive material. Subsequently, the respective bottom surfaces of backside contact(s) 182 and ILD 180 may be substantially horizontal and/or substantially coplanar.

In the depicted example, the backside BEOL network 184 is formed over the ILD 180 and upon the one or more backside contacts 182. The backside BEOL network 184 may be indirectly electrically and/or physically connected to the one or more bottom S/D regions 152, one or more top S/D regions 156, and/or one or more replacement gate structures 165 by one or more backside contacts 182. The backside BEOL network 184 is located directly on the backside surface of ILD 180, backside contacts 182, etc. The backside BEOL network 184 can include one or more interconnect dielectric material layers (including one of the dielectric materials mentioned above for the frontside ILD layer 158) and contains backside metal wires embedded therein. In some embodiments, the backside metal wires within the frontside BEOL network 184 are composed of Cu. The backside BEOL network 184 can include "x" numbers of frontside metal levels, wherein "x" is an integer starting from 1. If not included in frontside BEOL network 172, backside BEOL network 184 may further contain conductive pads that are connected to one or more of the backside metal wires and may be used to connect the semiconductor IC device 100 to the external and/or higher-level structure.

In an example, signal routing and power routing is effectively split between the frontside BEOL network 172 and the backside BEOL network 184. For example, at least 90% of the frontside metal wires (e.g., furthest from the transistor(s)) are signal routing metal wires and the remainder frontside metal wires, which are usually present in metal levels closest to the transistor, can be used as power routing wires. Further in this example, at least 90% of the backside metal wires that are in metal levels closest to the transistor(s) are power routing metal wires and the remainder backside metal wires which are usually present in metal levels furthest away from the transistor, can be used as signal routing wires. Power routing wires may be less dense signal routing wires. A signal routing wire is defined herein as a conductive feature, such as a wire, trace, or the like, that is configured to electrically carry a functional or logical potential or signal that is to change or is otherwise dynamic over time. A power routing wire is defined herein as a conductive feature, such as a wire, trace, plane, or the like, that is configured to electrically carry a logical potential that does not change over time. For example, a power routing wire carries or otherwise has a functional power potential, such as VDD, VSS, or the like. For clarity, in some examples, the backside BEOL network 184 may be a backside power distribution network (BSPDN).

For clarity, semiconductor IC device 100 may include a bottom transistor and a top transistor. The top transistor is vertically stacked, or aligned, with respect to the bottom transistor. In an example, the top S/D region 156 of the top transistor and the bottom S/D region 152 of the bottom transistor are electrically isolated from each other. In an example, the top transistor and the bottom transistor have a different polarity. For example, the top transistor is a nFET transistor and the bottom transistor is a pFET transistor, or vice versa. In an example, the top transistor and the bottom transistor share a common replacement gate structure 165. The channels or active nanolayers 108 of the top transistor, the channels or active nanolayers 108 of the bottom transistor, and the dual MDI structure may be vertically inline (e.g., share a vertical bisector, or the like).

IC device 100 may be an integrated circuit (IC) chip. IC chips can be distributed by the fabricator in raw wafer form (that is, as a single wafer that has multiple unpackaged chips), as a bare die, or in a packaged form. In the latter case, the IC chip may mount in a single chip package (such as a plastic carrier, with leads that are affixed to a motherboard or other higher-level carrier) or in a multichip package (such as a ceramic carrier that has either or both of surface interconnections and buried interconnections). In any case, the IC chip may be integrated with other chips, discrete circuit elements, and/or other signal processing devices as part of either (a) an intermediate product, such as a motherboard, or (b) an end product. The end product can be any product that includes the IC chip, ranging from toys and other low-end applications to advanced computer products having a display, a keyboard or other input device, and a central processor.

Figure 17:
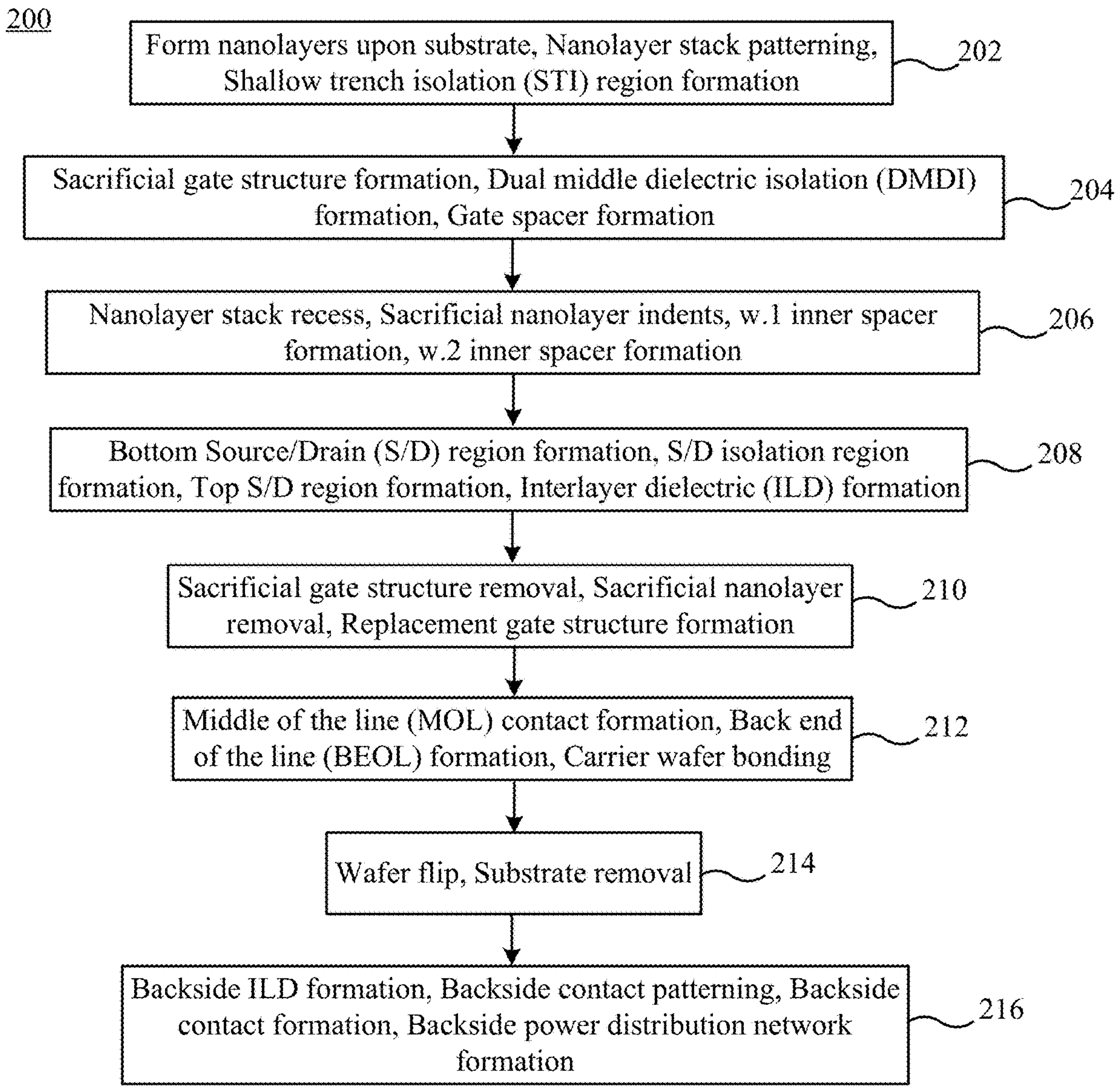
FIG. 17 depicts a flowchart of a method of fabricating a semiconductor IC device that includes a gate with a removed or reduced gate region between dual MDI regions, according to one or more embodiments of the disclosure.

FIG. 17 depicts a flow diagram illustrating method 200 to fabricate a semiconductor IC device, such as semiconductor IC device 100. The depicted fabrication operations of method 200 are illustrated and described above with reference to one or more of FIG. 2 through FIG. 16 of the drawings, which describe the fabrication of semiconductor IC device 100, though the fabrication operations described in method 200 may be used to fabricate other types of semiconductor IC devices. The method 200 depicted herein is illustrative. There can be many variations to the diagram or operations described therein without departing from the spirit of the embodiments. For instance, the operations can be performed in a differing order, or operations can be added, deleted, or modified.

At block 202, method 200 may begin with forming nanolayers upon a substrate, patterning the nanolayers into one or more nanolayer stacks, and forming one or more shallow trench isolation (STI) regions. For example, method 200 may include forming a first series of alternating sacrificial nanolayers 106 and active nanolayers 108 upon a substrate structure 102. Method 200 may further include forming a bottom sacrificial nanolayer 109 upon the first series of alternating sacrificial nanolayers 106 and active nanolayers 108, forming a sacrificial nanolayer 107 upon the bottom sacrificial nanolayer 109, and forming a top sacrificial nanolayer 109 upon the sacrificial nanolayer 107. Further, method 200 may further include forming a second series of alternating sacrificial nanolayers 106 and active nanolayers 108 upon the top sacrificial nanolayer 109.

Further, method 200 may include pattering the nanolayers to form one or more nanolayer stack(s) 103 and forming STI regions 110 therebetween. For example, predetermined portions of the nanolayers may be removed and a well within the substrate structure 102 may be formed. The portions of the nanolayers that remain may effectively form the one or more nanolayer stacks 103 and respective STI regions 110 may be formed within the substrate well between the nanolayer stacks 103.

At block 204, method 200 may further continue with forming one or more sacrificial gate structure(s), with forming one or more gate spacers upon the one or more sacrificial gate structure(s), and with forming a dual middle dielectric isolation (DMDI) structure. For example, method 200 may include forming one or more sacrificial gate structures 121 upon the substrate structure 102, upon the STI regions 110, and upon and around the nanolayer stack(s) 103. Further, method 200 may include removing the top and bottom sacrificial nanolayers 109 to form respective nanolayer cavities 126. Method 200 may include forming one or more gate spacer(s) 130 upon the substrate structure 102 and/or upon the STI regions 110 and upon the sidewall(s) of the sacrificial gate structures 121. For example, the gate spacer(s) 130 may be formed upon the substrate structure 102 or upon the STI regions 110, may be formed upon and around nanolayer stack(s) 103 and may be formed upon and around the one or more sacrificial gate structure(s) 121, respectively. Method 200 may further include forming top MDI region 128 and the bottom MDI region 129 within respective nanolayer cavities 126 within the one or more nanolayer stacks 103.

At block 206, method 200 may further continue with recessing the nanolayer stacks, with indenting the sacrificial nanolayers within the nanolayer stacks, with forming a narrow inner spacer (e.g., a spacer with width w.1) within a respective recesses or indent and with forming one a wide inner spacer (e.g., a spacer with wider width w.2) within a respective recesses or indent between the top MDI region 128 and the bottom MDI region 129. For example, method 200 may include forming S/D recesses 132 within the nanolayer stack(s) 103 between gate spacers 130 associated with neighboring sacrificial gate structures 121. Further, method 200 may include indenting the sacrificial nanolayers 106 and sacrificial nanolayer 107 within nanolayer stack(s) 103, thereby forming one or more indents 135 and one or more indents 137 that are located between the top MDI region 128 and the bottom MDI region 129. The removal of sacrificial nanolayer 107 may occur at a fast rate relative to the material of sacrificial nanolayers 106 and the horizontal depth of the indents 137 are deeper than the horizontal depth of the indents 135.

Method 200 may further include forming an inner spacer 144 within a respective indent 135 and an inner spacer 145 within a respective indent 137. Because the horizontal depth of indent 137 is greater than the horizontal depth of indent 135, the horizontal width of inner spacer 145 is greater than the horizontal width of inner spacer 144.

At block 208, method 200 may further continue with forming one or more bottom S/D regions, with forming one or more S/D isolation region, with forming one or more top S/D regions, and with forming an ILD. For example, method 200 may include forming one or more bottom S/D regions 152 upon the substrate structure 102. Method 200 may include forming a respective S/D isolation region 154 upon one or more of the bottom S/D regions 152. Still further, method 200 may include forming a respective top S/D region 156 upon one or more of the S/D isolation regions 154. Still further, method 200 may include forming ILD 158 upon the top S/D region 156, upon STI region(s) 110, and upon the sidewall(s) of the sacrificial gate structures 121.

At block 210, method 200 may continue with removing the one or more sacrificial gate structure(s), with removing the sacrificial nanolayers, and with forming a replacement gate structure within the void or recess formed by the absence of a respective sacrificial gate structure. For example, method 200 may include removing the sacrificial gate structure(s) 121 and with removing the sacrificial nanolayers 106 thereunder to form respective replacement gate openings 159. Method 200 may further include forming a respective replacement gate structure 165 within the replacement gate openings 159.

At block 212, method 200 may continue with MOL contact formation and with frontside back end of line (BEOL) network formation. For example, method 200 may include forming ILD 158.1 upon the replacement gate structure(s) 165 and upon the ILD 158 and with forming one or more frontside contacts 170 within the ILD 158.1, ILD 158. The frontside contact 170 may contact a predetermined region within the semiconductor IC device 100 (e.g., top S/D region 156, top S/D region 156 and bottom S/D region 152, replacement gate structure 165, or the like). Further, method 200 may include forming the frontside BEOL network 172 upon the ILD 158.1 and upon the frontside contact(s) 170.

At block 214, method 200 may continue with flipping the semiconductor IC device 100 and removing the substrate. For example, the semiconductor IC device 100 is flipped and the lower substrate 101 is removed, the etch stop layer 104 is removed, and the upper substrate 105 is removed.

At block 216, method 200 may continue with forming a backside ILD, with forming one or more backside contacts, and with forming a backside BEOL network. For example, ILD 180 may be formed upon and around STI regions 110, formed upon and around the one or more bottom S/D regions 152, and formed upon respective bottom surfaces of replacement gate structure(s) 165 and inner spacers 144. Method 200 may further include forming one or more backside contact(s) 182 which may be formed by initially forming backside contact opening(s) and filling the backside opening (s) with a conductive material. Respective backside contacts 182 may contact a predetermined region within the semiconductor IC device 100 (e.g., bottom S/D region 152, or the like). Method 200 may further include forming backside BEOL network 184 upon the ILD 180 and upon the one or more backside contact(s) 182.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A vertically stacked transistor comprising:

a bottom transistor comprising a plurality of vertically arranged bottom channels and a top transistor comprising a plurality of vertically arranged top channels;

a dual middle dielectric isolation (MDI) structure comprising a bottom MDI region and a top MDI region; and a gate structure shared by the bottom transistor and the top transistor, the gate structure comprising a reduced gate region between the bottom MDI region and the top MDI region.

2. The vertically stacked transistor of claim 1, further comprising:

a first inner spacer between the bottom MDI region and the top MDI region; and a second inner spacer between the bottom MDI region and the top MDI region.

3. The vertically stacked transistor of claim 2, wherein the reduced gate region is between the first inner spacer and the second inner spacer.

4. The vertically stacked transistor of claim 1, wherein the gate structure has a smaller gate length in the reduced gate region relative to a remainder of the gate structure.

5. The vertically stacked transistor of claim 2, further comprising:

a plurality of third inner spacers upon respective top surfaces and bottom surfaces of the bottom channels and the top channels, wherein the first inner spacer and the second inner spacer are wider than the plurality of third inner spacers.

6. The vertically stacked transistor of claim 2, further comprising:

a source/drain (S/D) isolation region comprising a top surface above a top surface of the top MDI region and a bottom surface below a bottom surface of the bottom MDI region.

7. The vertically stacked transistor of claim 6, wherein the bottom transistor further comprises a bottom S/D region connected to respective end surfaces of the bottom channels and connected to and below the S/D isolation region.

8. The vertically stacked transistor of claim 7, wherein the top transistor further comprises a top S/D region connected to respective end surfaces of the top channels and connected to and above the S/D isolation region.

9. The vertically stacked transistor of claim 6, wherein the S/D isolation region is connected to the top MDI region, the first inner spacer, and the bottom MDI region.

* * * * *